(12) United States Patent
Mori et al.

(10) Patent No.: US 8,890,402 B2
(45) Date of Patent: Nov. 18, 2014

(54) ORGANIC ELECTROLUMINESCENCE DISPLAY DEVICE

(75) Inventors: Hiroyuki Mori, Kanagawa (JP); Hidemasa Hosoda, Kanagawa (JP); Masanori Hikita, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 977 days.

(21) Appl. No.: 12/686,504

(22) Filed: Jan. 13, 2010

(65) Prior Publication Data

US 2010/0194717 A1 Aug. 5, 2010

(30) Foreign Application Priority Data

Feb. 3, 2009 (JP) .................................. 2009-022609

(51) Int. Cl.
*H01L 51/50* (2006.01)
*H01L 51/52* (2006.01)
*H01L 27/32* (2006.01)

(52) U.S. Cl.
CPC ......... H01L 51/5268 (2013.01); *H01L 27/3274* (2013.01); *H01L 51/5271* (2013.01)
USPC .......................................... 313/501; 313/504

(58) Field of Classification Search
CPC ......... H01L 51/50; H01L 27/32; H05B 33/02
USPC ................. 313/501, 504, 506; 445/24
See application file for complete search history.

(56) References Cited

U.S. PATENT DOCUMENTS

| | | | | |
|---|---|---|---|---|
| 6,608,449 B2 * | 8/2003 | Fukunaga | ................. | 315/169.3 |
| 2005/0007000 A1 * | 1/2005 | Chou et al. | ................. | 313/116 |
| 2005/0142379 A1 | 6/2005 | Juni et al. | | |
| 2007/0063641 A1 | 3/2007 | Cok et al. | | |
| 2007/0126352 A1 * | 6/2007 | Okutani | ........................ | 313/506 |
| 2007/0126358 A1 | 6/2007 | Okutani et al. | | |
| 2008/0176041 A1 | 7/2008 | Sato et al. | | |

FOREIGN PATENT DOCUMENTS

| | | |
|---|---|---|
| JP | 2991183 | 10/1999 |
| JP | 2001-330712 | 11/2001 |
| JP | 2002-270365 | 9/2002 |
| JP | 2004-014385 | 1/2004 |
| JP | 2004-296429 | 10/2004 |

(Continued)

OTHER PUBLICATIONS

English Translation of JP2005-190931, published Jul. 14, 2005.*

(Continued)

*Primary Examiner* — Mary Ellen Bowman
(74) *Attorney, Agent, or Firm* — Riverside Law LLP

(57) ABSTRACT

The present invention provides an organic electroluminescence display device including an organic electroluminescence element which includes a transparent electrode, a counter electrode, and an organic compound layer provided between the transparent electrode and the counter electrode, the organic compound layer including a light emitting layer, and a fine particle-containing layer positioned in the optical path of light emitted from the light emitting layer and adjacent to the transparent electrode, wherein the fine particle-containing layer contain an organic resin material having a refractive index equal to or lower than the refractive index of the transparent electrode, and fine particles having a refractive index higher than the refractive index of the organic resin material and a weight average particle diameter of 0.5 μm to 5 μm, and the fine particle-containing layer has a thickness of 2 μm to 10 μm.

7 Claims, 3 Drawing Sheets

(56) References Cited

FOREIGN PATENT DOCUMENTS

| | | |
|---|---|---|
| JP | 2005-070318 | 3/2005 |
| JP | 2005-190931 | 7/2005 |
| JP | 2005275214 | 10/2005 |
| JP | 2006-054197 | 2/2006 |
| JP | 2006-107744 | 4/2006 |
| JP | 2006-184587 | 7/2006 |
| JP | 2007249191 | 9/2007 |
| JP | 2008-515130 | 5/2008 |
| JP | 2008218328 | 9/2008 |
| WO | 2006035625 | 4/2006 |
| WO | 2006095612 | 9/2006 |
| WO | 2007038070 | 4/2007 |

OTHER PUBLICATIONS

English Translation of JP2008-218328, published Sep. 18, 2008.*
JP Office Action dated Apr. 17, 2012, with English translation; Application No. 2009-022609.
Extended European Search Report dated May 6, 2011, Application No. 10152242.3.
Notice for Reasons of Rejection for Japanese Patent Application 2009-022609, dated Sep. 25, 2012, 3 pages (in Japanese).
English translation of Notice for Reasons of Rejection for Japanese Patent Application 2009-022609, dated Sep. 25, 2012, 3 pages.

* cited by examiner

ORGANIC ELECTROLUMINESCENCE DISPLAY DEVICE

BACKGROUND OF THE INVENTION

1. Field of the Invention

The present invention relates to an organic electroluminescence display device.

2. Description of the Related Art

Organic electroluminescence display devices (organic EL display devices) are self-light emitting type display devices and are for use in display and illumination. The organic EL display has such advantages of display performance that it is high in visibility, and free from viewing angle dependency, as compared to conventional CRTs and LCDs, and also has advantages in that display devices can be made lighter and thinner. Meanwhile, organic EL illumination has advantages, in addition to enabling lighter and thinner devices, in possibility of achieving lighting fixture having a shape that has not yet been achieved so far, by using a flexible substrate.

The organic electroluminescence display devices have superior features as described above, but the refractive index of each of layers constituting a display device, including a light emitting layer, is higher than the refractive index of air. For instance, in an organic electroluminescence display device, an organic thin-film layer, such as a light emitting layer, has a refractive index of 1.6 to 2.1. Therefore, emitting light is liable to be totally reflected at an interface, and the efficiency of extraction of light is less than 20%. Thus, the majority of light is lost.

As measures for improving the efficiency of extraction of light, for example, the following methods are proposed: a method in which a transparent layer is provided adjacent to a transparent electrode on a light extraction surface side, and an area for substantively causing reflection of light and disturbance of scattering angle adjacent to the light extraction surface of the transparent layer or inside the transparent layer (for example, see Japanese Patent Application Laid-Open (JP-A) No. 2004-296429); a method in which in an optical path in which light emitted from a light emitting layer travels from an organic substance layer to a light transmissive insulating layer, a fine particle-dispersed layer is provided, in which fine particles are dispersed in a base material (for example, see Japanese Patent Application Laid-Open (JP-A) No. 2006-107744); a method of forming a diffraction grating or a zone plate at a position where total reflection at an interface of an organic EL element is prevented (for example, see Japanese Patent (JP-B) No. 2991183); and a method in which an optical unit is provided, between a light transmissive substrate and a light transmissive electrode, which is configured so that, in a range of angles at which light is totally reflected at an interface between the light transmissive substrate and the light transmissive electrode, at least a part of light incident on the light transmissive electrode is scattered and/or diffracted to go out via the light transmissive substrate, and incident light entering the light transmissive substrate and the light transmissive electrode is weakly scattered and/or transmitted to go out via the light transmissive substrate (for example, see Japanese Patent Application Laid-Open (JP-A) No. 2006-54197).

However, in the method disclosed in JP-A No. 2004-296429, in order to improve the efficiency of light scattering, it is necessary to thicken the thickness of the area for causing reflection of light and disturbance of scattering angle, and thus it is difficult to make a hole in the area, making it impossible to use the method in organic electroluminescence display devices.

In the method disclosed in JP-A No. 2006-107744, the fine particle-dispersed layer has a thin thickness and fine particles contained therein have large diameters, and thus leading to poor light scattering efficiency, and the fine particles easily aggregate, leading to large-size concaves/convexes in a surface of the fine particle-dispersed layer, resulting in occurrence of image bleeding and image blur. Furthermore, the method disclosed in JP-A No. 2006-107744 has a problem that the production process is complex.

The methods disclosed in JP-B No. 2991183 and JP-A No. 2006-54197 cause a problem that the efficiency of extraction of light is still insufficient.

BRIEF SUMMARY OF THE INVENTION

The present invention aims to solve the above-mentioned problems in the related art and to achieve the following object. Specifically, the object of the present invention is to provide an organic electroluminescence display device capable of improving the efficiency of extraction of light and reducing image bleeding.

Means for solving the foregoing problems are as follows.
<1> An organic electroluminescence display device including:
an organic electroluminescence element which includes a transparent electrode, a counter electrode, and an organic compound layer provided between the transparent electrode and the counter electrode, the organic compound layer including a light emitting layer, and
a fine particle-containing layer positioned in the optical path of light emitted from the light emitting layer and adjacent to the transparent electrode,
wherein the fine particle-containing layer contains an organic resin material having a refractive index equal to or lower than the refractive index of the transparent electrode, and fine particles having a refractive index higher than the refractive index of the organic resin material and a weight average particle diameter of 0.5 μm to 5 μm, and the fine particle-containing layer has a thickness of 2 μm to 10 μm.

In the organic electroluminescence display device according to <1>, light emitted from the light emitting layer is scattered when the light passes through the fine particle-containing layer.
<2> The organic electroluminescence display device according to <1>, wherein the fine particles in the fine particle-containing layer are primary particles.
<3> The organic electroluminescence display device according to one of <1> and <2>, wherein the fine particle-containing layer further contains a fine-particle dispersant.
<4> The organic electroluminescence display device according to any one of <1> to <3>, further including a reflection plate disposed on a surface of the fine particle-containing layer opposite to a surface thereof provided with the transparent electrode, an interlayer insulating layer disposed on a surface of the reflection plate opposite to a surface thereof adjacent to the fine particle-containing layer, and a substrate disposed on a surface of the interlayer insulating layer opposite to a surface thereof adjacent to the reflection plate.

The organic electroluminescence display device according to <4> adopts a top emission type configuration in which light emitted from a light emitting layer passes through a transparent electrode, the light that has passed through the transparent electrode passes through a fine particle-containing layer, the light that has passed through the fine particle-containing layer is reflected at a surface of a reflection plate, the reflected light at the surface of the reflection plate then passes through the fine particle-containing layer, and the light that has passed through the fine particle-containing layer then passes through the transparent electrode.

<5> The organic electroluminescence display device according to any one of <1> to <3>, further including a substrate disposed on the surface of the fine particle-containing layer opposite to a surface thereof provided with the transparent electrode.

The organic electroluminescence display device according to <5> adopts a bottom emission type configuration in which light emitted from a light emitting layer passes through a transparent electrode, the light that has passed through the transparent electrode passes through a fine particle-containing layer, and the light that has passes through the fine particle-containing layer passes through a substrate.

<6> The organic electroluminescence display device according to any one of <4> to <5>, further including an organic thin-film transistor disposed on a passivation layer.

<7> The organic electroluminescence display device according to <6>, wherein the drive system of the organic electroluminescence display device is a thin-film transistor drive.

<8> The organic electroluminescence display device according to one of <6> and <7>, wherein in the fine particle-containing layer, a contact hole is formed for connecting the transparent electrode and the organic thin-film transistor.

According to the present invention, it is possible to solve the problems in the related art and to provide an organic electroluminescence display device capable of improving the efficiency of extraction of light and reducing image bleeding.

DETAILED DESCRIPTION OF THE INVENTION

Figure 1:
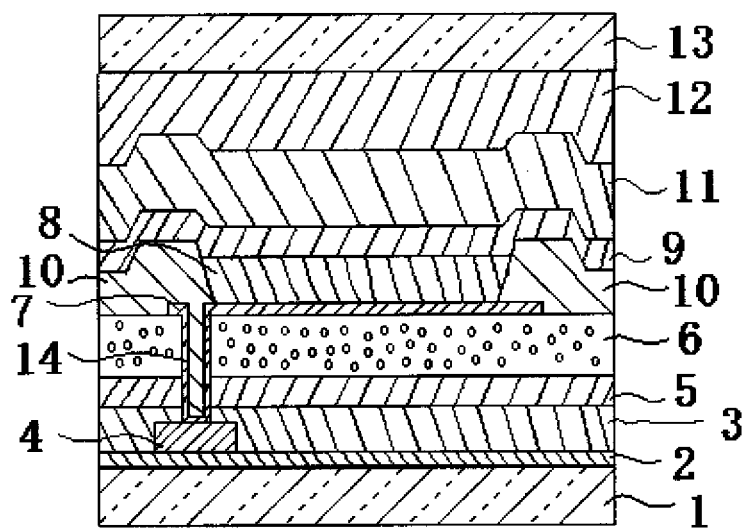
FIG. 1 is a view illustrating one example of a configuration of a top emission type organic electroluminescence display device.

Hereinafter, an organic electroluminescence display device according to the present invention will be described in detail.

(Organic Electroluminescence Display Device)

The organic electroluminescence display device includes at least an organic EL element and a fine particle-containing layer, and further includes other members as required.

<Organic EL Element>

The organic EL element has a cathode, an anode (a transparent electrode and a counter electrode), and organic compound layers including a light emitting layer (an organic light emitting layer) between both of the electrodes. In terms of the properties of the light emitting element, at least one of the electrodes for the anode and cathode is preferably transparent.

As a configuration of the laminated organic compound layer, an aspect is preferable in which a hole transporting layer, an organic light emitting layer, and an electron transporting layer are stacked in this order as viewed from the anode side. The laminated organic compound layer further includes a hole injection layer between the hole transporting layer and the anode, and/or an electron transporting intermediate layer between the organic light emitting layer and the electron transporting layer. In addition, a hole transporting intermediate layer may be provided between the organic light emitting layer and the hole transporting layer. Similarly, an electron injection layer may be provided between the cathode and the electron transporting layer.

Note that each of these layers may have a plurality of secondary layers.

The organic light emitting layer corresponds to the light emitting layer, and the anode and cathode and the individual layers other than the organic light emitting layer respectively correspond to the above-mentioned other members.

Each of the layers constituting the organic compound layer can be favorably formed by any of the methods selected from a dry-process film forming method such as vapor deposition, and sputtering; a transfer method, printing method, coating method, inkjet method, and spray method.

<<Anode>>

The anode is generally sufficient to have the function of an electrode to supply holes to the organic compound layer. The shape, structure, and size of the anode are not particularly limited, and these may be arbitrarily selected from known materials of electrode in accordance with the intended use and purpose of the light emitting element. As described above, the anode is provided as the transparent anode.

Preferred examples of the material of the anode include metals, alloys, electrically conductive compounds and mixtures of these materials. Specific examples of the material of the anode include tin oxides doped with antimony, fluorine, etc. (ATO, FTO); electrically conductive metal oxides such as tin oxide, zinc oxide, indium oxide, indium tin oxide (ITO), and indium zinc oxide (IZO); metals such as gold, silver, chromium, and nickel, mixtures and laminates of these metals with electrically conductive metal oxides; inorganic electrically conductive materials such as copper iodide, and copper sulfide; organic electrically conductive materials such as polyaniline, polythiophene, and polypyrrole, and laminates of these organic electrically conductive materials with ITO, etc. Among these materials, preferred are electrically conductive metal oxides, and ITO is especially preferred from the viewpoint of productivity, high-conductivity, transparency and the like.

The anode can be formed on the substrate by a method arbitrarily selected from among wet-process methods such as a printing method, and a coating method; physical methods such as a vacuum vapor deposition method, a sputtering method, and an ion-plating method; and chemical methods such as a CVD method, and a plasma CVD method, taking the suitability with the material constituting the anode into consideration. For instance, if ITO is selected as the material of the anode, the anode can be formed according to a direct current or high-frequency sputtering method, a vacuum vapor deposition method, an ion-plating method, etc.

In the organic EL element, the position of the anode to be formed is not particularly limited, and the anode can be formed anywhere in accordance with the intended use and purpose of the light emitting element. The anode is however preferably formed on the substrate. In this case, the anode may be formed on the entire surface of one side of the substrate or may be formed at a part of the substrate.

In the formation of the anode, patterning of the anode may be carried out by chemical etching such as photo-lithography, may be carried out by physical etching with use of a laser, etc., may be carried out by vacuum vapor deposition or sputtering on a superposed mask, or a lift-off method or a printing method may be used.

The thickness of the anode can be optionally selected depending on the material constituting the anode, and cannot be unequivocally defined. However, it is usually about 10 nm to about 50 µm, preferably 50 nm to 20 µm.

The value of resistance of the anode is preferably $10^3$ Ω/square or lower, more preferably $10^2$ Ω/square or lower. When the anode is transparent, it may be color-less and transparent, or may be colored and transparent. In order to collect light from the transparent anode side, the transmittance of the anode is preferably 60% or higher, more preferably 70% or higher.

In connection with transparent anodes, detailed description is found in Yutaka Sawada supervised "*Tomei Denkyoku-Maku no Shintenkai* (New Developments of Transparent Electroconductive Films)" CMC Publishing Co., Ltd. (1999), and the description therein can be applied to the present invention. When a plastic substrate low in heat resistance is used, a transparent anode film formed with ITO or IZO at a low temperature of 150° C. or lower is preferred.

<<<Cathode>>

The cathode is generally sufficient to have the function as an electrode to inject electrons to the organic compound layer. The shape, structure and size of the cathode are not particularly limited, and these can be arbitrarily selected from known materials of electrode in accordance with the intended use and purpose of the light emitting element.

Preferred examples of material constituting the cathode include metals, alloys, metal oxides, electrically conductive compounds and mixtures of these materials. Specific examples of the material of the cathode include alkali metals (e.g. Li, Na, K, Cs, etc.), alkaline earth metals (e.g. Mg, Ca, etc.), and rare earth metals such as gold, silver, lead, aluminum, sodium-potassium alloy, lithium-aluminum alloy, magnesium-silver alloy, indium, and ytterbium. These materials may be used alone, however, from the viewpoint of simultaneous achievement of stability and electron injection property, two or more materials can be preferably used in combination.

Among these, as the material constituting the cathode, alkali metals and alkaline earth metals are preferred in terms of the electron injecting property, and materials mainly containing aluminum are preferred for their excellent storage stability.

The materials mainly containing aluminum mean aluminum alone, alloys of aluminum with 0.01% by mass to 10% by mass of alkali metal or alkaline earth metal, or mixtures of these (e.g., lithium-aluminum alloy, magnesium-aluminum alloy, etc.).

The materials of the cathode are disclosed in detail in Japanese Patent Application Laid-Open (JP-A) Nos. 2-15595, and 5-121172, and the materials described therein can also be used in the present invention.

The cathode can be formed by known methods with no particular limitation. For example, the cathode can be formed according to a method arbitrarily selected from among wet-process methods such as a printing method, and a coating method; physical methods such as a vacuum vapor deposition method, a sputtering method, and an ion-plating method; and chemical methods such as a CVD method, and a plasma CVD method, taking the suitability with the material constituting the cathode in consideration. For example, in the case of selecting metals as the materials of the cathode, the cathode can be formed with one or two or more kinds of the materials at the same time or in order by a sputtering method, etc.

In the formation of the cathode, patterning of the cathode may be carried out by chemical etching such as photo-lithography, may be carried out by physical etching with use of a laser, etc., may be carried out by vacuum vapor deposition or sputtering on a superposed mask, or a lift-off method or a printing method may be used.

The position of the cathode to be formed is not especially limited and the cathode can be formed anywhere in the present invention. The cathode may be formed on the entire surface of the organic compound layer, or may be formed at a part thereof.

A dielectric layer composed of fluoride or oxide of alkali metal or alkaline earth metal may be inserted between the cathode and the organic layer in a thickness of from 0.1 nm to 5 nm. The dielectric layer can be regarded as a kind of an electron-injecting layer. The dielectric layer can be formed by, for example, a vacuum deposition method, a sputtering method, an ion plating method, etc.

The thickness of the cathode can be arbitrarily selected depending on the material constituting the anode, and cannot be unequivocally defined. However, it is usually about 10 nm to about 5 µm, and preferably 50 nm to 1 µm.

The cathode may be transparent or opaque. The transparent cathode can be formed by forming a film of the material of the cathode in a thickness of 1 nm to 10 nm, and further laminating a transparent conductive material such as ITO and IZO thereon.

<<<Organic Compound Layer>>

The organic EL element has at least one organic compound layer including an organic light emitting layer. As the organic compound layers other than the organic light emitting layer, there are exemplified a hole transporting layer, an electron transporting layer, a hole blocking layer, an electron blocking layer, a hole injection layer, an electron injection layer, and the like.

In the organic EL element of the present invention, each layer constituting the organic compound layer(s) can be suitably formed by any of a dry film-forming method such as a vapor deposition method, and a sputtering method; a wet-process coating method, a transfer method, a printing method, and an inkjet method.

<<<Organic Light Emitting Layer>>>

The light emitting layer is a layer having functions to receive, at the time of electric field application, holes from the anode, hole injecting layer or hole transporting layer, and to receive electrons from the cathode, electron injection layer or electron transporting layer, and offer the field of recombination of holes and electrons to emit light.

The organic light emitting layer may be composed of luminescent materials alone or may be composed of a mixed layer containing a host material and a luminescent dopant. The luminescent dopant may be a fluorescent luminescent material or a phosphorescent luminescent material, or may be two or more kinds thereof. The host material is preferably a charge transporting material. The host material may be one or two or more kinds thereof, and for example, it may be a mixed layer composed of an electron-transporting host material with a hole-transporting host material. The organic light emitting layer may further contain a no-light emitting material having no charge transportability.

The organic light emitting layer may be a single layer or may be composed of two or more layers, and each layer may emit light in different luminescent color.

As for the luminescent dopant, both of a phosphorescent luminescent material and a fluorescent luminescent material can be used as the dopant (phosphorescent luminescent dopant, fluorescent luminescent dopant).

The organic light emitting layer may contain two or more kinds of luminescent dopants for improving the color purity and for expanding a light-emitting wavelength range. The luminescent dopant is preferably, in reference to a difference in ionization potential ($\Delta$Ip) with respect to the host compound and a difference in electron affinity ($\Delta$Ea) with respect to the host compound, a dopant which further satisfies relationships of 1.2 eV>$\Delta$Ip>0.2 eV, and/or 1.2 eV>$\Delta$Ea>0.2 eV, from the viewpoint of driving durability.

The phosphorescent luminescent dopant is not particularly limited and may be suitably selected in accordance with the intended use. For example, complexes containing a transition metal atom or a lanthanoid atom are exemplified.

The transition metal atom is not particularly limited and may be suitably selected in accordance with the intended use, however, preferred transition metals are ruthenium, rhodium, palladium, tungsten, rhenium, osmium, iridium, gold, silver, copper, and platinum; more preferred are rhenium, iridium, and platinum, with particular preference being given to iridium, and platinum.

The lanthanoid atom is not particularly limited and may be suitably selected in accordance with the intended use. Examples thereof include lanthanum, cerium, praseodymium, neodymium, samarium, europium, gadolinium, terbium, dysprosium, holmium, erbium, thulium, ytterbium, and lutetium. Among these, preferred are neodymium, europium, and gadolinium.

As ligands of the complex, there are exemplified ligands described in "Comprehensive Coordination Chemistry" authored by G. Wilkinson, published by Pergamon Press Ltd. (1987), "Photochemistry and Photophysics of Coordination Compounds" authored by H. Yersin, published by Springer-Verlag Co. in 1987, and "*Yuhki Kinzoku Kagaku-Kiso To Ouyou* (Organic Metal Chemistry—Devices and Applications) authored by Akio Yamamoto, published by Shokabo Publishing Co., Ltd. in 1982.

Specific preferred examples of the ligands include halogen ligands (preferably chlorine ligands); aromatic carbon ring ligands (e.g., cyclopentadienyl anions, benzene anions, or naphthyl anions and the like, these ligands preferably have 5 to 30 carbon atoms, more preferably have 6 to 30 carbon atoms, still more preferably 6 to 20 carbon atoms, particularly preferably have 6 to 12 carbon atoms); nitrogen-containing heterocyclic ligands (e.g., phenylpyridine, benzoquinoline, quinolinol, bipyridyl, phenanthroline and the like, these ligands preferably have 5 to 30 carbon atoms, more preferably have 6 to 30 carbon atoms, still more preferably have 6 to 20 carbon atoms, particularly preferably have 6 to 12 carbon atoms); diketone ligands (e.g., acetylacetone and the like), carboxylic acid ligands (e.g., acetic acid ligands and the like, these ligands preferably have 2 to 30 carbon atoms, more preferably have 2 to 20 carbon atoms, particularly preferably 2 to 16 carbon atoms); alcoholate ligands (e.g., phenolate ligands and the like, these ligands preferably have 1 to 30 carbon atoms, more preferably have 1 to 20 carbon atoms, still more preferably 6 to 20 carbon atoms); silyloxy ligands (e.g., trimethylsilyloxy ligand, dimethyl-tert-butylsilyloxy ligand, triphenylsilyloxy ligand and the like, these ligands preferably have 3 to 40 carbon atoms, more preferably have 3 to 30 carbon atoms, particularly preferably 3 to 20 carbon atoms); carbon monoxide ligands, isonitryl ligands, and cyano ligands, phosphorous ligands (e.g., triphenylphosphine ligand and the like, these ligands preferably have 3 to 40 carbon atoms, more preferably have 3 to 30 carbon atoms, still more preferably have 3 to 20 carbon atoms, particularly preferably 6 to 20 carbon atoms); thiolate ligands (e.g., phenylthiolate ligand and the like, these ligands preferably have 1 to 30 carbon atoms, more preferably have 1 to 20 carbon atoms, still more preferably have 6 to 20 carbon atoms); phosphineoxide ligands (e.g., triphenylphosphine oxide ligand and the like, these ligands preferably have 3 to 30 carbon atoms, more preferably have 8 to 30 carbon atoms, still more preferably have 18 to 30 carbon atoms), with more preference being given to nitrogen-containing heterocyclic ligands.

The complexes may have one transition metal atom in the compound or may have two or more transition metal atoms, that is, may be a so-called dinuclear complex. The complexes may concurrently contain different two or more kinds of metal atoms.

As the luminescent dopant, there are exemplified phosphorescent luminescent compounds described in U.S. Pat. No. 6,303,238B1, U.S. Pat. No. 6,097,147, WO00/57676, WO00/70655, WO01/08230, WO01/39234A2, WO01/41512A1, WO02/02714A2, WO02/15645A1, WO02/44189A1, WO05/19373A2, Japanese Patent Application Laid-Open (JP-A) Nos. 2001-247859, 2002-302671, 2002-117978, 2003-133074, 2002-235076, 2003-123982, 2002-170684, EP 1211257, Japanese Patent Application Laid-Open (JP-A) Nos. 2002-226495, 2002-234894, 2001-247859, 2001-298470, 2002-173674, 2002-203678, 2002-203679, 2004-357791, 2006-256999, 2007-19462, 2007-84635, and 2007-96259. Among these phosphorescent luminescent compounds, preferred are Ir complexes, Pt complexes, Cu complexes, Re complexes, W complexes, Rh complexes, Ru complexes, Pd complexes, Os complexes, Eu complexes, Tb complexes, Gd complexes, Dy complexes, and Ce complexes; and more preferred are Ir complexes, Pt complexes, and Re complexes. Of these, still more preferred are Ir complexes, Pt complexes, and Re complexes each having at least one ligand forming a metal-carbon bond, a metal-nitrogen bond, a metal-oxygen bond, or a metal-sulfur bond. Particularly preferred are Ir complexes, Pt complexes, and Re complexes each including tridentate or higher multidentate ligands.

The fluorescent light-emitting dopant is not particularly limited and may be suitably selected in accordance with the intended use. Examples thereof include benzoxazole, benzimidazole, benzothiazole, styrylbenzene, polyphenyl, diphenyl butadiene, tetraphenylbutadiene, naphthalimide, coumarin, pyrane, perinone, oxadiazole, aldazine, pyralizine, cyclopentadiene, bis-styryl anthracene, quinacridone, pyrrolopyridine, thiadiazolopyridine, styryl amine, aromatic dimethylidyne compounds, aromatic condensed polycyclic compounds (anthracene, phenanthroline, pyrene, perylene, rubrene, pentacene, etc.), a variety of metal complexes typified by metal complexes of 8-quinolinol, pyrromethene complexes, and rare-earth complexes; polymer compounds such as polythiophene, polyphenylene, polyphenylene vinylene; organic silane, and derivatives thereof.

Examples of the luminescent dopant include compounds represented by each of the following structural formulas, but are not limited thereto.

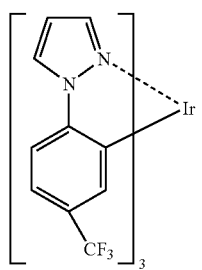
D-1
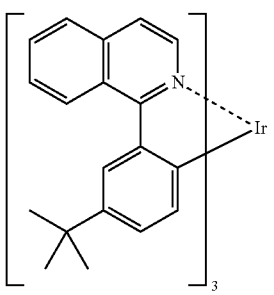
D-6
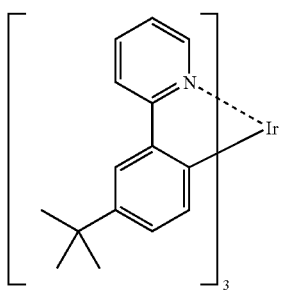
D-2
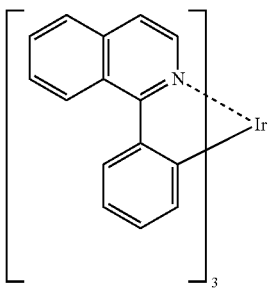
D-7
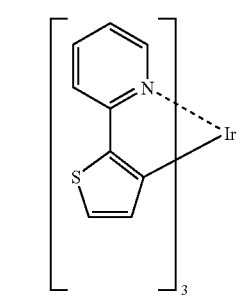
D-3
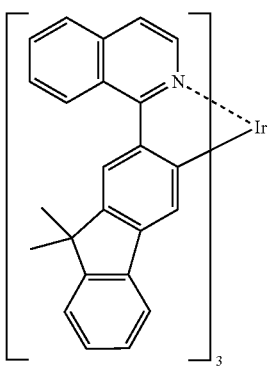
D-8
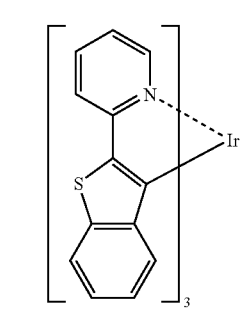
D-4
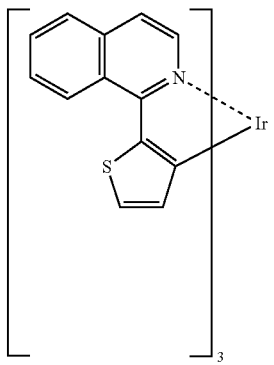
D-9
D-5
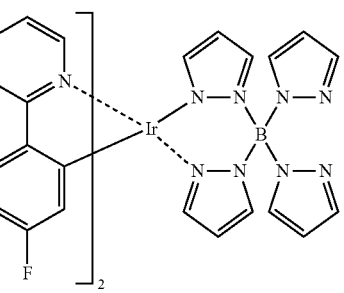
D-10

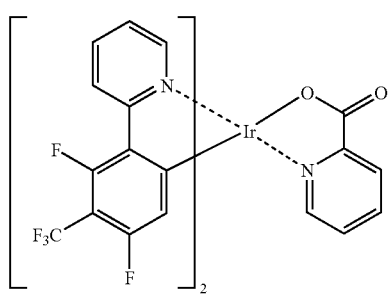
D-11
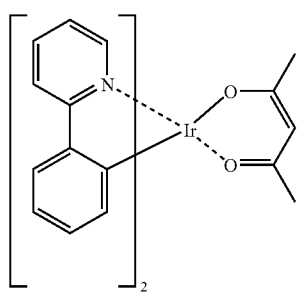
D-12
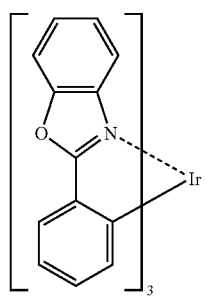
D-13
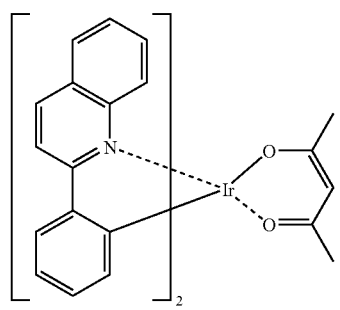
D-14
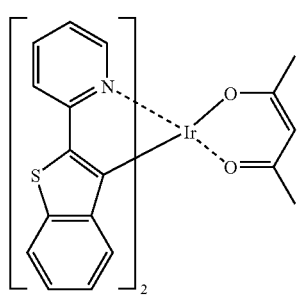
D-15
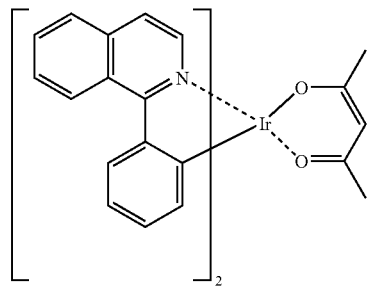
D-16
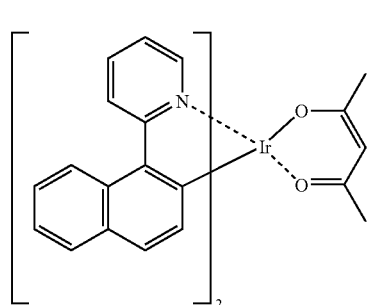
D-17
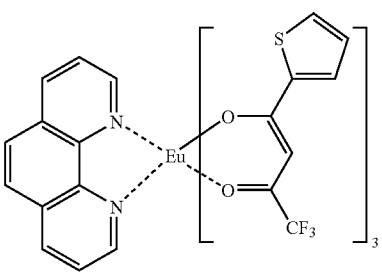
D-18
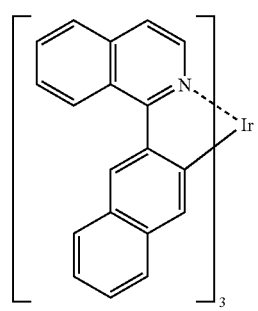
D-19
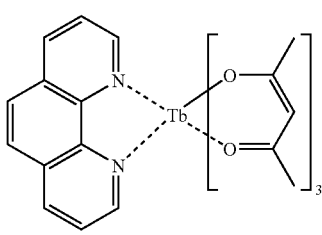
D-20

D-21 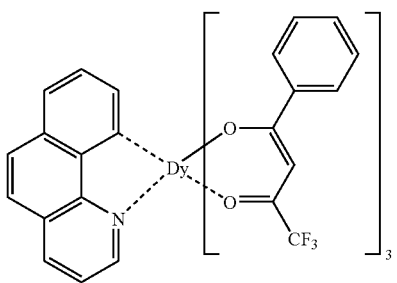
D-22 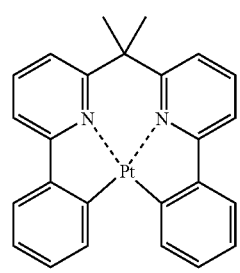
D-23 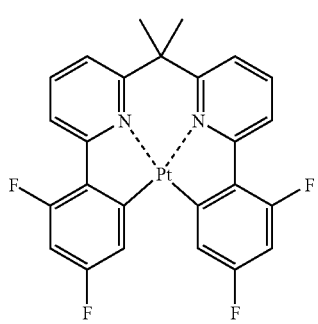
D-24 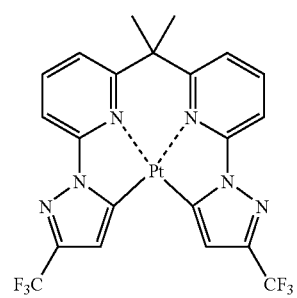
D-25 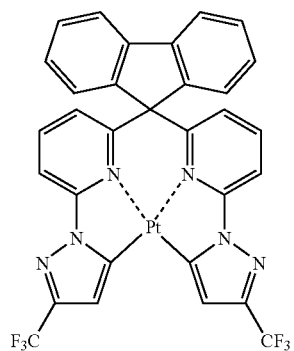
D-26 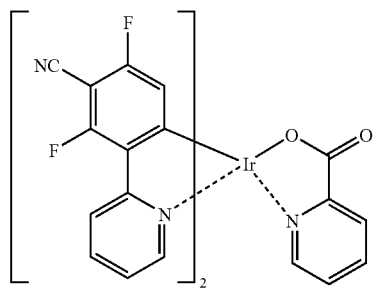
D-27 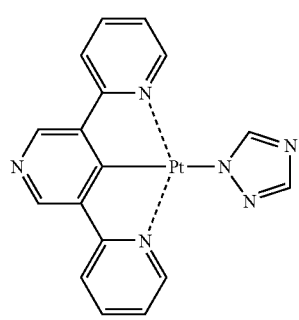
D-28 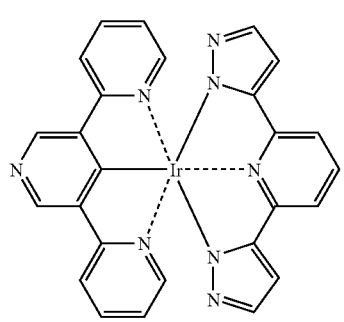
D-29 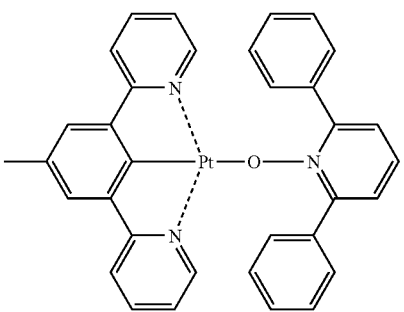
D-30 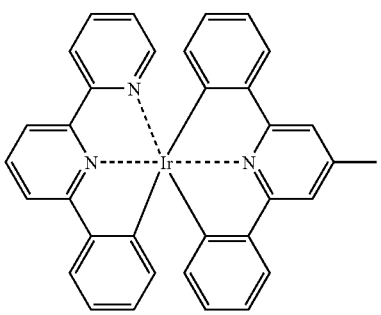

D-31
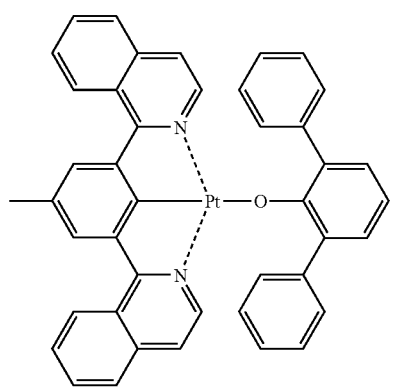
D-32
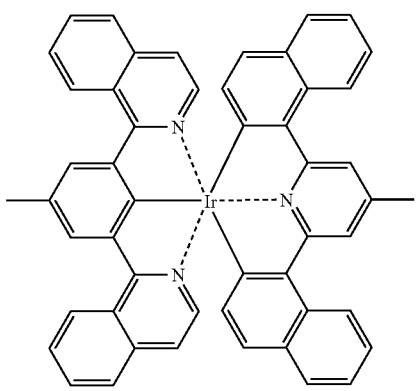
D-33
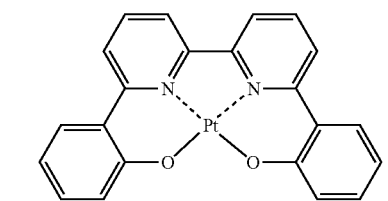
D-34
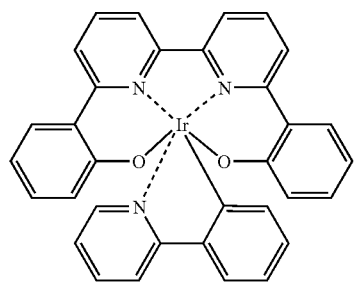
D-35
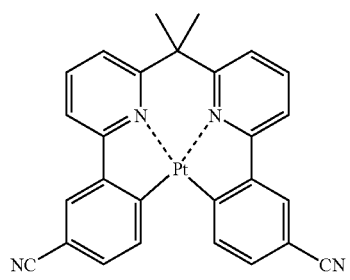
D-36
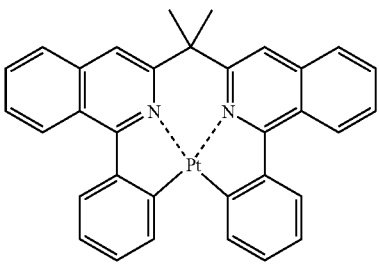
D-37
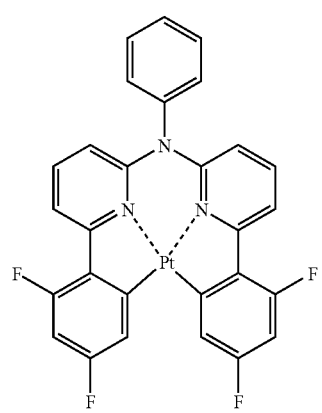
D-38
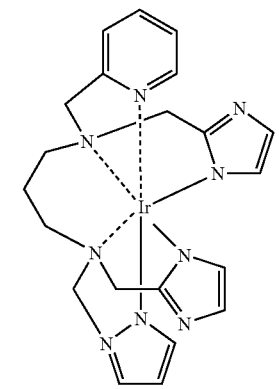
D-39
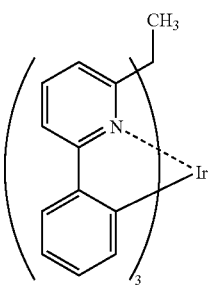

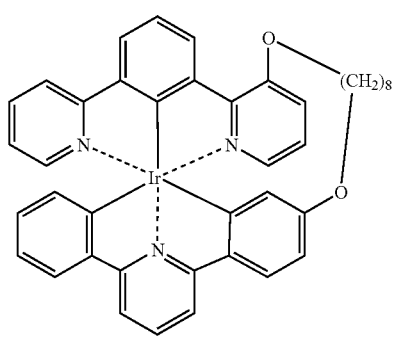

D-40

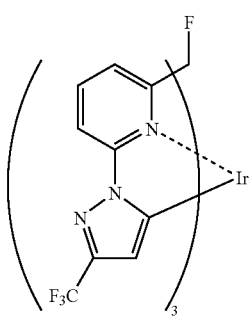

D-41

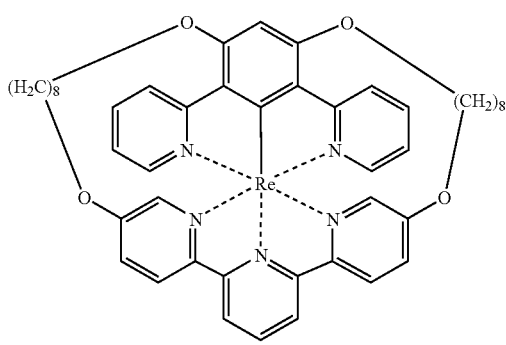

D-42

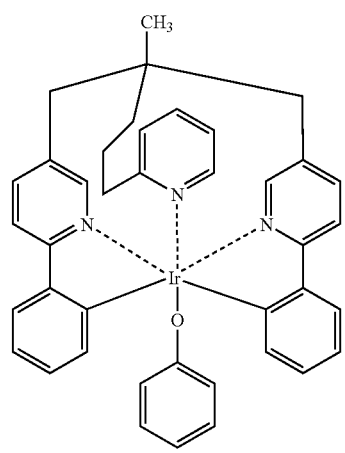

D-43

The luminescent dopant in the organic light emitting layer is generally contained in an amount of 0.1% by mass to 50% by mass with respect to the total mass of the compound forming the organic light emitting layer. From the viewpoint of durability and external quantum efficiency, it is however preferably contained in an amount of 1% by mass to 50% by mass, more preferably contained in an amount of 2% by mass to 40% by mass.

The thickness of the organic light emitting layer is not particularly limited, but, generally, it is preferably 2 nm to 500 nm. From the viewpoint of external quantum efficiency, it is more preferably 3 nm to 200 nm, particularly preferably 5 nm to 100 nm.

As the host material, hole-transporting host materials (otherwise, may be referred to as "hole transporting hosts") superior in hole transportability, and electron-transporting host compounds (otherwise, may be referred to as "electron transporting hosts") superior in electron transportability can be used.

Specific examples of the hole transporting hosts in the organic light emitting layer include the following materials: pyrrole, indole, carbazole, azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, electrically conductive high-molecular oligomers such as thiophene oligomers, polythiophenes and the like, organic silanes, carbon films, derivatives thereof.

The hole transporting hosts preferably indole derivatives, carbazole derivatives, aromatic tertiary amine compounds or thiophene derivatives, more preferably compounds having a carbazole group in their molecules, particularly preferably compounds having a t-butyl-substituted carbazole group in their molecules.

The electron transporting hosts in the organic light emitting layer preferably have an electron affinity Ea, from the viewpoint of improvement of durability and reduction in driving electric voltage, of 2.5 eV to 3.5 eV, more preferably 2.6 eV to 3.4 eV, particularly preferably 2.8 eV to 3.3 eV, and preferably have an ionization potential Ip, from the viewpoint of improvement of durability and reduction in driving electric voltage, of 5.7 eV to 7.5 eV, more preferably 5.8 eV to 7.0 eV, particularly preferably 5.9 eV to 6.5 eV.

Specific examples of such electron transporting hosts include pyridine, pyrimidine, triazine, imidazole, pyrazole, triazole, oxazole, oxadiazole, fluorenone, anthraquinodimethane, anthrone, diphenylquinone, thiopyrandioxide, carbodiimide, fluorenylidenemethane, distyrylpyrazine, fluorine-substituted aromatic compounds, heterocyclic tetracarboxylic anhydrides of naphthalene, perylene or the like, phthalocyanine, derivatives thereof (which may form a condensed ring with another ring), and a variety of metal complexes typified by metal complexes of 8-quinolinol derivatives, metal phthalocyanine, and metal complexes having benzoxazole or benzothiazole as the ligand.

Preferred examples of the electron transporting hosts are metal complexes, azole derivatives (benzimidazole derivatives, imidazopyridine derivatives etc.), and azine derivatives (pyridine derivatives, pyrimidine derivatives, triazine derivatives etc.). Among these, more preferred are metal complex compounds, from the viewpoint of durability. A metal complex compound (A), a metal complex having containing a ligand having at least one nitrogen atom, oxygen atom, or sulfur atom to be coordinated with the metal is more preferable.

Although a metal ion in the metal complex is not particularly limited, a beryllium ion, a magnesium ion, an aluminum ion, a gallium ion, a zinc ion, an indium ion, a tin ion, a platinum ion, or a palladium ion is preferred; more preferred is a beryllium ion, an aluminum ion, a gallium ion, a zinc ion, a platinum ion, or a palladium ion; and further preferred is an aluminum ion, a zinc ion, a platinum ion or a palladium ion.

Although there are a variety of well-known ligands to be contained in the above-described metal complexes, examples thereof include ligands described in "Photochemistry and Photophysics of Coordination Compounds" authored by H. Yersin, published by Springer-Verlag Co. in 1987; "*YUHKI KINZOKU KAGAKU-KISO TO OUYOU*(Organometallic Chemistry—Fundamental and Application—)" authored by Akio Yamamoto, published by Shokabo Publishing Co., Ltd. in 1982; and the like.

As the ligands, preferred are nitrogen-containing heterocyclic ligands (preferably having 1 to 30 carbon atoms, more preferably having 2 to 20 carbon atoms, particularly preferably having 3 to 15 carbon atoms). The ligands may be monodentate ligands or bidentate or higher ligands, but are preferably from bidentate ligands to hexadentate ligands, and mixed ligands of a monodentate ligand with a bidentate to hexadentate ligand are also preferable.

Specific examples of the ligands include azine ligands (e.g. pyridine ligands, bipyridyl ligands, terpyridine ligands, etc.); hydroxyphenylazole ligands (e.g. hydroxyphenyzenzimidazole ligands, hydroxyphenylbenzoxazole ligands, hydroxyphenylimidazole ligands, hydroxyphenylimidazopyridine ligands, etc.); alkoxy ligands (e.g. methoxy, ethoxy, butoxy and 2-ethylhexyloxy ligands, and these ligands preferably have 1 to 30 carbon atoms, more preferably have 1 to 20 carbon atoms, particularly preferably have 1 to 10 carbon atoms); aryloxy ligands (e.g. phenyloxy, 1-naphthyloxy, 2-naphthyloxy, 2,4,6-trimethylphenyloxy, and 4-biphenyloxy ligands, and these ligands preferably have 6 to 30 carbon atoms, more preferably have 6 to 20 carbon atoms, particularly preferably have 6 to 12).

In addition to the above, specific examples thereof include heteroaryloxy ligands (e.g. pyridyloxy, pyrazyloxy, pyrimidyloxy, quinolyloxy ligands and the like, and those having preferably 1 to 30 carbon atoms, more preferably 1 to 20 carbon atoms, and particularly preferably 1 to 12 carbon atoms); alkylthio ligands (e.g. methylthio, ethylthio ligands and the like, and those having preferably 1 to 30 carbon atoms, more preferably 1 to 20 carbon atoms, and particularly preferably 1 to 12 carbon atoms); arylthio ligands (e.g. phenylthio ligands and the like, and those having preferably 6 to 30 carbon atoms, more preferably 6 to 20 carbon atoms, and particularly preferably 6 to 12 carbon atoms); heteroarylthio ligands (e.g. pyridylthio, 2-benzimidazolylthio, 2-benzoxazolylthio, 2-benzothiazolylthio ligands and the like, and those having preferably 1 to 30 carbon atoms, more preferably 1 to 20 carbon atoms, and particularly preferably 1 to 12 carbon atoms); siloxy ligands (e.g. a triphenylsiloxy group, a triethoxysiloxy group, a triisopropylsiloxy group and the like, and those having preferably 1 to 30 carbon atoms, more preferably 3 to 25 carbon atoms, and particularly preferably 6 to 20 carbon atoms); aromatic hydrocarbon anion ligands (e.g. a phenyl anion, a naphthyl anion, an anthranyl anion and the like, and those having preferably 6 to 30 carbon atoms, more preferably 6 to 25 carbon atoms, and particularly preferably 6 to 20 carbon atoms); aromatic heterocyclic anion ligands (e.g. a pyrrole anion, a pyrazole anion, a triazole anion, an oxazole anion, a benzoxazole anion, a thiazole anion, a benzothiazole anion, a thiophene anion, a benzothiophene anion and the like, and those having preferably 1 to 30 carbon atoms, more preferably 2 to 25 carbon atoms, and particularly preferably 2 to 20 carbon atoms); and indolenine anion ligands. Among these, nitrogen-containing heterocyclic ligands, aryloxy ligands, heteroaryloxy groups, siloxy ligands are preferable. Nitrogen-containing aromatic heterocyclic ligands, aryloxy ligands, siloxy ligands, aromatic hydrocarbon anion ligands, and aromatic heterocyclic anion ligands are more preferable.

Examples of the metal complex electron transporting hosts include compounds described, for example, in Japanese Patent Application Laid-Open (JP-A) Nos. 2002-235076, 2004-214179, 2004-221062, 2004-221065, 2004-221068, and 2004-327313.

In the organic light emitting layer, the lowest triplet excitation energy (T1) value in the host materials is preferably higher than the T1 value of the phosphorescent luminescent materials, in view of color purity, external quantum efficiency, and driving durability.

The amount of the host compound is not particularly limited, however, it is preferably 15% by mass to 95% by mass with respect to the total mass of the compound forming the light emitting layer, from the viewpoint of the luminescence efficiency and driving voltage.

<<<Hole Injection Layer and Hole Transporting Layer>>>

The hole injection layer and the hole transporting layer are layers functioning to receive holes from an anode or from an anode side and to transport the holes to a cathode side. A hole injection material and a hole transporting material for use in these layers may be low-molecular weight compounds or high-molecular weight compounds.

Specifically, the hole injection layer and the hole transporting layer are preferably layers containing, for example, pyrrole derivatives, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, phthalocyanine compounds, porphyrin compounds, thiophene compounds, organic silane derivatives, carbon, or the like.

An electron-accepting dopant may be introduced into the hole injection layer or the hole transport layer in the organic EL element of the present invention. As the electron-accepting dopant to be introduced into a hole injection layer or a hole transport layer, either or both of an inorganic compound or an organic compound may be used as long as the compound has electron accepting property and a property for oxidizing an organic compound.

Specific examples of the inorganic compound include metal halides, such as iron (II) chloride, aluminum chloride, gallium chloride, indium chloride and antimony pentachloride, and metal oxides, such as vanadium pentaoxide, and molybdenum trioxide.

In the case of employing the organic compounds, compounds having a substituent such as a nitro group, a halogen, a cyano group, a trifluoromethyl group or the like; quinone compounds; acid anhydride compounds; fullerenes; and the like may be preferably applied.

Besides the above compounds, it is possible to favorably use compounds described in patent documents such as Japanese Patent Application Laid-Open (JP-A) Nos. 6-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, and 2005-209643.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5- dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalone, 1,5-dinitronaphthalene, 9,10-anthraquinone, 1,3,6,8-tetranitrocarbazole, 2,4,7-trinitro-9-fluorenone, 2,3,5,6-tetracyanopyridine, or fullerene C60 is preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, or 2,3,5,6-tetracyanopyridine is more preferable, and tetrafluorotetracyanoquinodimethane is particularly preferable.

These electron-accepting dopants may be used alone or in a combination. Although an applied amount of these electron-accepting dopants depends on the type of material, 0.01% by mass to 50% by mass is preferred with respect to a hole transporting layer material, 0.05% by mass to 20% by mass is more preferable, and 0.1% by mass to 10% by mass is particularly preferred.

The thickness of the hole injection layer and the thickness of the hole transporting layer are each preferably 500 nm or less, from the viewpoint of reducing driving voltage.

The thickness of the hole transporting layer is preferably 1 nm to 500 nm, more preferably 5 nm to 200 nm, still more preferably 10 nm to 100 nm. The thickness of the hole injection layer is preferably 0.1 nm to 200 nm, more preferably 0.5 nm to 100 nm, still more preferably 1 nm to 100 nm.

The hole injection layer and the hole transporting layer may take a single-layer structure containing one or two or more of the above-mentioned materials, or a multilayer structure composed of plural layers of a homogeneous composition or a heterogeneous composition.

<<<Electron Injection Layer and Electron Transporting Layer>>>

The electron injection layer and the electron transporting layer are layers having functions for receiving electrons from a cathode or from a cathode side, and transporting electrons to an anode side. An electron injection material and an electron transporting material for use in these layers may be low-molecular weight compounds or high-molecular weight compounds.

Specifically, the hole injection layer and the hole transporting layer are preferably layers containing, for example, pyridine derivatives, quinoline derivatives, pyrimidine derivatives, pyrazine derivatives, phthalazine derivatives, phenanthroline derivatives, triazine derivatives, triazole derivatives, oxazole derivatives, oxadiazole derivatives, imidazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, aromacyclic tetracarboxylic anhydrides of perylene, naphthalene or the like, phthalocyanine derivatives, metal complexes typified by metal complexes of 8-quinolinol derivatives, metal phthalocyanine, and metal complexes containing benzoxazole, or benzothiazole as the ligand, organic silane derivatives typified by silole, and the like.

The electron injection layer or the electron transporting layer in the organic EL element of the present invention may contain an electron donating dopant. As the electron donating dopant introduced in the electron injection layer or the electron transporting layer, any material may be used as long as it has an electron-donating property and a property for reducing an organic compound, and alkaline metals such as Li, alkaline earth metals such as Mg, transition metals including rare-earth metals, and reducing organic compounds are preferably used. As the materials, particularly, metals having a work function of 4.2 eV or less are preferably used, and specific examples thereof include Li, Na, K, Be, Mg, Ca, Sr, Ba, Y, Cs, La, Sm, Gd, Yb, and the like. Specific examples of the reducing organic compounds include nitrogen-containing compounds, sulfur-containing compounds, phosphorus-containing compounds, and the like.

Besides the above materials, it is possible to use materials described in Japanese Patent Application Laid-Open (JP-A) Nos. 6-212153, 2000-196140, 2003-68468, 2003-229278, 2004-342614, and the like.

These electron donating dopants may be used alone or in combination. An applied amount of the electron donating dopants differs dependent on the types of the materials, but it is preferably from 0.1% by mass to 99% by mass with respect to an electron transporting layer material, more preferably from 1.0% by mass to 80% by mass, and particularly preferably from 2.0% by mass to 70% by mass.

The thickness of the electron injection layer and the thickness of the electron transporting layer are each preferably 500 nm or less from the viewpoint of reducing driving voltage.

The thickness of the electron transporting layer is preferably from 1 nm to 500 nm, more preferably from 5 nm to 200 nm, particularly preferably 10 nm to 100 nm. The thickness of the electron injection layer is preferably from 0.1 nm to 200 nm, more preferably from 0.2 nm to 100 nm, particularly preferably from 0.5 nm to 50 nm.

The electron injection layer and the electron transporting layer may take a single layer structure containing one or two or more of the above-mentioned materials, or a multilayer structure composed of plural layers of a homogeneous composition or a heterogeneous composition.

<<<Hole Blocking Layer>>>

The hole blocking layer is a layer having a function to prevent holes transported from the anode side to the light emitting layer from passing through the cathode side. The hole blocking layer can be provided as an organic compound layer contiguous to the light emitting layer on the cathode side.

As a compound constituting the hole blocking layer, for example, aluminum complexes such as BAlq, triazole derivatives, and phenanthroline derivatives such as BCP are exemplified.

The thickness of the hole blocking layer is preferably 1 nm to 500 nm, more preferably 5 nm to 200 nm, particularly preferably 10 nm to 100 nm.

The hole blocking layer may take a single-layer structure containing one or two or more of the above-mentioned materials, or a multilayer structure composed of plural layers of a homogeneous composition or a heterogeneous composition.

<<<Electron Blocking Layer>>>

The electron blocking layer is a layer having a function to prevent electrons transported from the cathode side to the light emitting layer from passing through the anode side. In the present invention, the electron blocking layer can be provided as an organic compound layer contiguous to the light emitting layer on the anode side.

As a compound constituting the electron blocking layer, for example, those exemplified as hole transporting materials above can be used.

The thickness of the electron blocking layer is preferably 1 nm to 500 nm, more preferably 5 nm to 200 nm, particularly preferably 10 nm to 100 nm.

The hole blocking layer may take a single-layer structure containing one or two or more of the above-mentioned materials, or a multilayer structure composed of plural layers of a homogeneous composition or a heterogeneous composition.

<<Protective Layer>>

The entirety of the organic EL element may be protected by a protective layer.

Materials to be contained in the protective layer are sufficient to have a function to prevent substances accelerating deterioration of the device, such as moisture and oxygen, from entering into the device.

Specific examples of such materials include metals such as In, Sn, Pb, Au, Cu, Ag, Al, Ti, and Ni; metal oxides such as MgO, SiO, $SiO_2$, $Al_2O_3$, GeO, NiO, CaO, BaO, $Fe_2O_3$, $Y_2O_3$, and $TiO_2$; metal nitrides such as $SiN_x$, and $SiN_xO_y$; metal fluorides such as $MgF_2$, LiF, $AlF_3$, and $CaF_2$; copolymers of dichloroethylene with polyethylene, polypropylene, polymethylmethacrylate, polyimide, polyurea, polytetrafluoroethylene, polychlorotrifluoroethylene, polychlorotrifluoroethylene, polydichlorodifluoroethylene, and/or chlorotrifluoroethylene; a copolymer obtained by copolymerization of tetrafluoroethylene with a monomer mixture containing at least one co-monomer, a fluorine-containing copolymer having a cyclic structure at its copolymer main chain, hydrophilic substances having a coefficient of water absorption of 1% or higher, and water-vaporproof substances having a coefficient of water absorption of 0.1% or lower.

A method of forming the protective layer is not particularly limited and may be suitably selected in accordance with the intended use. For example, there are exemplified a vacuum deposition method, sputtering method, reactive sputtering method, MBE (Molecular Beam epitaxy) method, cluster ion beam method, ion plating method, plasma polymerization method (high-frequency excited ion[plating method], plasma CVD method, laser CVD method, thermal CVD method, gas-source CVD method, coating method, printing method, and transfer method.

<<Sealing>>

Furthermore, the organic EL element may be entirely sealed with a sealing container.

Additionally, a moisture absorbent or an inactive liquid may be encapsulated in a space between the sealing container and the light emitting element. The moisture absorber is not particularly limited and may be suitably selected in accordance with the intended use. Examples thereof include barium oxides, sodium oxides, potassium oxides, calcium oxides, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieves, zeolite, and magnesium oxide. The inactive liquid is not particularly limited and may be suitably selected in accordance with the intended use. Examples thereof include paraffins, fluid paraffins, fluorine solvents such as perfluoroalkane, perfluoroamine, and perfluoroether; chlorine solvents, and silicone oils.

In addition, the sealing method employed in a resin sealing layer described below is also preferably used.

<<<Resin Sealing Layer>>>

The organic EL element preferably has functions to prevent the organic EL element-self from being brought into contact with atmosphere and to suppress degradation of the element performance due to oxygen and moisture.

Resin materials for use in the resin sealing layer is not particularly limited and may be suitably selected in accordance with the intended use. Examples thereof include acrylic resins, epoxy resins, fluororesins, silicon resins, rubber resins, and ester resins. Among these resin materials, preferred are epoxy resins in terms of moisture-preventive capability. Among the epoxy resins, thermocurable epoxy resins, and photocurable epoxy resins are more preferred.

A method for producing the resin sealing layer is not particularly limited and may be suitably selected in accordance with the intended use. For example, there are exemplified a method of applying a resin solution, a method of contact bonding or thermally contact bonding a resin sheet, a method of dry polymerization through deposition, sputtering, or the like.

The thickness of the resin sealing layer is preferably 1 μm to 1 mm, more preferably 5 μm to 100 μm, particularly preferably 10 μm to 50 μm. When the thickness is thinner than 1 μm, there is a possibility that the inorganic film is impaired when a second substrate is attached thereon. When it is thicker than 1 mm, the thickness of the electroluminescence element itself is thicker, possibly degrading thin-film property of the organic EL element, which is a characteristic thereof.

<<<Sealing Adhesive>>>

A sealing adhesive for use in the sealing has a function to prevent moisture and oxygen from entering into the organic EL element from its distal ends thereof.

As materials for the sealing adhesive, the same materials for the resin sealing layer can be used. Among the materials, in view of prevention of moisture, preferred is an epoxy adhesive, and more preferred are a photocurable adhesive and a thermocurable adhesive.

Further, it is preferred to add a filler to the above-mentioned materials. As a filler to be added to the sealing agent, inorganic materials such as $SiO_2$, SiO (silicon oxide), SiON (silicon oxynitride), SiN (silicone nitride) and the like are preferred. By adding a filler to the sealing agent, the viscosity of the sealing agent is increased, leading to improvements in process suitability and humidity resistance.

The sealing adhesive may contain a desiccating agent. As the desiccating agent, barium oxides, calcium oxides, strontium oxides are preferred.

An amount of the desiccating agent added to the sealing agent is preferably 0.01% by mass to 20% by mass, more preferably 0.05% by mass to 15% by mass. When the addition amount is less than 0.01% by mass, the effect of adding the desiccating agent is reduced. When it is more than 20% by mass, it is undesirably difficult to homogenously disperse the desiccating agent in the sealing adhesive.

[Formulation of Sealing Adhesive]

Composition and Concentration of Polymer

The sealing adhesive is not particularly limited and the one described above can be used. For example, as a photocurable epoxy-based adhesive, XNR5516 produced by Nagase Chemtech Co. is exemplified. This sealing adhesive is directly added to and dispersed in the desiccating agent.

Thickness

The coating thickness of the sealing adhesive is preferably from 1 μm to 1 mm. When the coating thickness is thinner than 1 μm, unfavorably, the sealing adhesive cannot be uniformly applied. When it is thicker than 1 mm, unfavorably, a leak path that allows moisture to enter the interior of the organic EL element widens.

The sealing adhesive containing the desiccating agent is applied in an arbitrary amount to a surface of a substrate by a dispenser or the like, and a second substrate is superposed on the coated substrate, followed by curing, and thus a functional element can be obtained.

<<Driving>>

By the application of DC (if necessary, AC component may be contained) voltage (generally from 2 volts to 15 volts) between the anode and the cathode, or by the application of DC electric current, light emission of the organic electroluminescence element of the invention can be obtained.

As to the driving method of the organic EL element, the driving methods disclosed in Japanese Patent Application Laid-Open (JP-A) Nos. 2-148687, 6-301355, 5-29080, 7-134558, 8-234685, 8-241047, Japanese Patent (JP-B) No. 2784615, U.S. Pat. Nos. 5,828,429, and 6,023,308 can be applied to the present invention.

The organic EL element can be improved in the efficiency of extraction of light by various known contrivances. For example, it is possible to improve the efficiency of extraction of light and improve external quantum efficiency by processing the shape of the substrate surface (for example, by forming a minute concave-convex pattern), by controlling the refractive indices of the substrate, ITO layer and organic layer, and by controlling the thicknesses of the substrate, ITO layer and organic layer.

The organic EL element of the invention may be what is called top emission system of collecting light from the anode side.

The organic EL element of the invention can take a structure in which a charge generating layer is provided between a plurality of light emitting layers for improving luminous efficiency.

The charge generating layer has functions of generating charge (holes and electrons) at the time of application of electric field and injecting the generated charge to the layer contiguous to the charge-generating layer.

As the material for forming the charge generating layer, any material can be used so long as it has the above functions, and the charge generating layer may contain a single compound or a plurality of compounds.

Specifically, the material may be a material having conductivity, may be a material having semi-conductivity such as a doped organic layer, or may be a material having an electric insulating property, and examples of the materials include disclosed in Japanese Patent Application Laid-Open (JP-A) Nos. 11-329748, 2003-272860, and 2004-39617.

More specifically, transparent conductive materials such as ITO and IZO (indium zinc oxide), Fullerenes such as C60, conductive organic materials such as oligothiophene, conductive organic materials such as metallic phthalocyanines, metal-free phthalocyanines, metallic porphyrins, and metal-free porphyrins, metallic materials such as Ca, Ag, Al, Mg:Ag alloy, Al:Li alloy, and Mg:Li alloy, hole-conductive materials, electron-conductive materials, and mixtures of these materials may be used.

As the hole-conductive materials, for example, materials obtained by doping oxidants having an electron-withdrawing property such as F4-TCNQ, TCNQ, $FeCl_3$ to hole-transporting organic materials such as 2-TNATA and NPD, P-type conductive polymers, and P-type semiconductors are exemplified. As the electron-conductive materials, for example, materials obtained by doping metals or metallic compounds having a work function of less than 4.0 eV to electron-transporting organic materials, N-type conductive polymers, and N-type semiconductors are exemplified. As the N-type semiconductors, N-type Si, N-type CdS, and N-type ZnS are exemplified, and the P-type semiconductors, P-type Si, P-type CdTe, and P-type CuO are exemplified. Further, an electrically insulating material such as $V_2O_5$ can also be used as the charge-generating layer.

The charge generating layer may be a single layer, or a laminate of a plurality of layers. As the structure of lamination of a plurality of layers, a layer having a structure of the lamination of a material having conductivity such as a transparent conductive material or a metallic material and a hole-conductive material or an electron-conductive material, and a layer having a structure of the lamination of the hole-conductive material and the electron-conductive material are exemplified.

Generally, it is preferred to select the film thickness and materials of the charge generating layer so that a visible light transmittance is 50% or higher. The film thickness is not particularly limited and may be suitably selected in accordance with the intended use. It is preferably 0.5 nm to 200 nm, more preferably 1 nm 100 nm, still more preferably 3 nm to 50 nm, particularly preferably 5 nm to 30 nm.

The forming method of the charge generating layer is not particularly limited, and the forming method of the organic compound layers can be used.

The charge generating layer is formed between each two layers of a plurality of light emitting layers, and the anode side and the cathode side of the charge generating layer may contain materials having a function of injecting charge to the contiguous layers. For heightening an electron injecting property to the layer contiguous to the anode side, electron injecting compounds such as BaO, SrO, $Li_2O$, LiCl, LiF, $MgF_2$, MgO, $CaF_2$ may be laminated on the anode side of the charge generating layer.

Besides the above description, the materials of the charge generating layer can be selected with reference to Japanese Patent Application Laid-Open (JP-A) No. 2003-45676, U.S. Pat. Nos. 6,337,492, 6,107,734, and 6872472.

The organic EL element may have a resonator structure. For example, the organic EL element has a multilayer film mirror including a plurality of laminated films different in refractive index, a transparent or translucent electrode, a light emitting layer, and a metal electrode by superposition on a transparent substrate. The light generated from the light emitting layer repeats reflection and resonates between the multilayer film mirror and the metal electrode as reflectors.

As another preferred embodiment, a transparent or translucent electrode and a metal electrode respectively function as reflectors on a transparent substrate, and light generated from the light emitting layer repeats reflection and resonates between them.

To form a resonance structure, effective refractive indices of two reflectors, optical path determined by the refractive index and thickness of each layer between the reflectors are adjusted to be optimal values to obtain a desired resonance wavelength. The expression of the case of the first embodiment is disclosed in Japanese Patent Application Laid-Open (JP-A) No. 9-180883. The expression of the case of the second embodiment is disclosed in Japanese Patent Application Laid-Open (JP-A) No. 2004-127795.

<Fine Particle-Containing Layer>

The fine particle-containing layer is positioned in the optical path of light emitted from the light emitting layer and adjacent to a transparent electrode (e.g. ITO anode). By positioning the fine particle-containing layer adjacent to a transparent electrode (e.g. ITO anode) having a high refractive index, it is possible to provide a refractive index step between the transparent electrode (e.g. ITO anode) and the fine particle-containing layer and to thereby remarkably improve the efficiency of extraction of light.

The fine particle-containing layer contains at least an organic resin material and fine particles, and further contains other components as required.

The fine particle-containing layer is not particularly limited so long as it has a thickness of 2 μm to 10 μm and may be suitably selected in accordance with the intended use. It is however preferably 2 μm to 5 μm.

<<Organic Resin Material>>

The organic resin material is not particularly limited so long as it has a refractive index equal to or lower than that of the transparent electrode, and may be suitably selected in accordance with the intended use. Examples thereof include acrylic resins, polyimide resins and polyphenylene ether resins each having a refractive index of 1.7 or lower.

<<Fine Particles>>

The fine particles are not particularly limited so long as the particles have a refractive index higher than that of the organic resin material, and may be suitably selected in accordance with the intended use. Examples thereof include inorganic fine particles such as zinc oxide (refractive index: 1.9 to 2.0), alumina (refractive index: about 1.7), titanium oxide ($TiO_2$) (refractive index: about 2.6), and zirconia ($ZrO_2$) (refractive index: about 2.3); and organic fine particles such as melamine (refractive index: about 1.6), and benzoguanamine (refractive index: about 1.65).

The weight average particle diameter of the fine particles is not particularly limited so long as it is from 0.5 μm to 5 μm, and may be suitably selected in accordance with the intended use. It is however preferably from 0.5 μm to 2 μm. When the weight average particle diameter is smaller than 0.5 μm, the efficiency of extraction of light may be sometimes insufficient. When it is greater than 5 μm, concaves/convexes may take place on layer surfaces, possibly affecting the TFT driving. In contrast, with the weight average particle diameter being in the preferred range, it is advantageous in simultaneously satisfying both the efficiency of extraction of light and the TFT driving.

The fine particles are preferably dispersed (monodispersed) as primary particles in the fine particle-containing layer. By allowing the fine particles to be dispersed as primary particles in the fine particle-containing layer, it is possible to further improve the efficiency of extraction of light and to reduce image bleeding.

The method of dispersing the fine particles as primary particles in the fine particle-containing layer is not particularly limited, and may be suitably selected in accordance with the intended use. Examples thereof include irradiation of an ultrasonic wave, addition of the after-mentioned fine-particle-dispersant.

Whether or not the fine particles are dispersed as primary particles can be checked based on a particle size distribution thereof measured by a particle size distribution meter. When a measured particle size distribution has only one peak, it means that the fine particles are dispersed as primary particles. When a measured particle size distribution has two or more peaks, it means that the fine particles are dispersed as secondary particles.

<<Other Components>>

The other components are not particularly limited, and may be suitably selected in accordance with the intended use. Examples thereof include fine particle dispersants. The fine particle dispersant is added so that the fine particles are dispersed as primary particles in the fine particle-containing layer.

(Dispersant)

The dispersion of the fine particles of the present invention, it is preferred to use a dispersant having an anionic group. As the anionic group, groups having an acidic proton such as a carboxyl group, sulfonic acid group (sulfo group), phosphoric acid group (phosphono group), and sulfone amide group or salts thereof are effective. Among these, carboxyl group, sulfonic acid group, phosphoric acid group or salts thereof are preferred, and carboxyl group and phosphoric acid group are particularly preferred.

The number of anionic groups contained per molecule of the dispersant is sufficient to be one or more. For the purpose of improving the dispersibility of the fine particles, a plural number of anionic groups per molecule may be contained in the dispersant. The number of anionic groups per molecule is preferably two or more, more preferably five or more, particularly preferably 10 or more. Also, a plurality of types of anionic groups may be contained per molecule of the dispersant.

Specific examples of the dispersant having an anionic polar group include "PHOSPHANOL" {PE-510, PE-610, LB-400, EC-6103, RE-410 etc.; produced by Toho Chemical Industry Co., Ltd., "DISPERBYK" (-110, -111, -116, -140, -161, -162, -163, -164, -170, -171 etc.; produced by Byk Chemie Japan).

Preferably, the dispersant further contain a crosslinkable or polymerizable functional group. Examples of the crosslinkable or polymerizable functional group include ethylenically unsaturated groups capable crosslinking reaction/polymerization reaction by radical seeds {e.g. (meth)acryloyl group, aryl group, styryl group, vinyloxy group, etc.}, cationically polymerizable groups (epoxy group, oxetanyl group, vinyloxy group, etc.), and polycondensation reactive groups (hydrolyzable silyl group, N-methylol group, etc.). Preferred are functional groups having an ethylenically unsaturated group.

The dispersant for use in dispersion of the fine particles in the present invention is preferably a dispersant having an anionic group and a crosslinkable or polymerizable functional group and having the crosslinkable or polymerizable functional group on the side chains.

In the present invention, a mass average molecular weight (Mw) of the dispersant is not particularly limited, however, preferably 1,000 or more. A more preferred mass average molecular weight (Mw) of the dispersant is from 2,000 to 1,000,000, more preferably 5,000 to 200,000, particularly preferably 10,000 to 100,000.

Specific compounds of a dispersant that can be particularly preferably used in the present invention are described in paragraphs "0109" to "0110" in Japanese Patent Application Laid-Open (JP-A) No. 2004-29705.

An applied amount of the dispersant to the fine particles is preferably in the range of from 1% by mass to 50% by mass, more preferably from 5% by mass to 30% by mass, most preferably from 5% by mass to 20% by mass. As the dispersant, two or more kinds of dispersants may be used in combination.

<Other Members>

The other members are not particularly limited and may be suitably selected in accordance with the intended use. For example, substrates are exemplified.

<<Substrate>>

The substrate is not particularly limited and may be suitably selected in accordance with the intended use. It is however preferably a substrate that does not scatter or attenuate the light emitted from the organic compound layer(s). Specific examples of materials of the substrate include inorganic materials, e.g., yttria stabilized zirconia (YSZ), glass, etc., and organic materials, such as polyester, e.g., polyethylene terephthalate, polybutylene phthalate, polyethylene naphthalate, etc., polystyrene, polycarbonate, polyether sulfone, polyallylate, polyimide, polycycloolefin, norbornene resin, poly(chlorotrifluoroethylene), etc.

For instance, when glass is used as the substrate, alkali-free glass is preferably used as the material for reducing elution of ions from the glass. Further, when soda lime glass is used, it is preferred to provide a barrier coat such as silica. In the case of organic materials, materials excellent in heat resistance, dimensional stability, solvent resistance, electrical insulating properties and processability are preferably used.

The shape, structure and size of the substrate are not especially restricted, and these can be arbitrarily selected in accordance with the intended use and purpose of the light emitting element. In general, the substrate is preferably plate-shaped. The structure of the substrate may be a single layer structure or may be a lamination structure, and may consist of a single member or may be formed of two or more members.

The substrate may be colorless and transparent, or may be colored and transparent, but from the viewpoint of not scattering or attenuating the light emitted from the organic light emitting layer, a colorless and transparent substrate is preferably used.

The substrate can be provided with a moisture permeation preventing layer (a gas barrier layer) on the front surface or rear surface.

As the materials of the moisture permeation-preventing layer (the gas barrier layer), inorganic materials such as silicon nitride and silicon oxide are preferably used. The moisture permeation-preventing layer (the gas barrier layer) can be formed, for example, by a high frequency sputtering method.

When a thermoplastic substrate is used, if necessary, a hard coat layer and an undercoat layer may further be provided.

At the time of forming a TFT on the substrate, a passivation layer may be provided as a base of the TFT.

<Top Emission Type Organic Electroluminescence Display Device>

The top emission type organic electroluminescence display device is provided with, for example, as illustrated in FIG. 1, a glass substrate 1 (refractive index: about 1.5), a passivation layer 2 which is placed on the glass substrate 1 and composed of $SiN_x$, SiON, etc., an interlayer insulating layer 3 which is placed on the passivation layer 2 and composed of an acrylic resin, etc., an organic thin film transistor (TFT) 4, which is disposed on the passivation layer 2 and contiguous to the interlayer insulating layer 3, a reflection plate 5 which is placed on the interlayer insulating layer 3 and composed of metal such as aluminum and silver, a fine particle-containing layer 6 which is placed on the reflection plate 5 and contains an organic resin material (refractive index: about 1.5), fine particles (refractive index: higher than 1.5) and the like, a transparent electrode (an anode) 7 (refractive index: about 1.9) which is placed on the fine particle-containing layer 6 and composed of ITO or the like, an organic compound layer 8 (refractive index: about 1.8) which is placed on the transparent electrode (the anode) 7 and includes a light emitting layer, etc., a counter electrode (a semi-transmissive cathode) 9 which is placed on the organic compound layer 8 and composed of aluminum, silver or the like, a bank 10 which is placed on the fine particle-containing layer 6 so as to be contiguous to the transparent electrode (the anode) 7, the organic compound layer 8 and the counter electrode (the semi-transmissive cathode) 9 and composed of an acrylic resin or the like, a sealing layer 11 (refractive index: about 1.75) which is placed on the counter electrode (the semi-transmissive cathode) 9 and composed of $SiN_x$, SiON, etc., an adhesive layer 12 (refractive index: about 1.55) which is placed on the sealing layer 11 and composed of an epoxy resin, etc., and a substrate 13 (refractive index: about 1.5) which is placed on the adhesive layer 12 and composed of glass or the like.

The interlayer insulating layer 3 and the fine particle-containing layer 6 also functions as a flattening film for flattening the organic thin film transistor (TFT) 4.

A contact hole 14 is formed through the interlayer insulating layer 3, the reflection plate 5 and in the fine particle-containing layer 6 so that the transparent electrode (the anode) 7 and the organic thin film transistor (TFT) 4 are connected to each other.

Since the fine particle-containing layer 6 has such a thin thickness of 2 μm to 10 μm, the contact hole 14 can be easily formed, thereby making it possible to reduce the production cost.

Also, fine particles having a refractive index higher than that of the organic resin material are contained in the fine particle-containing layer 6, light emitted from the light emitting layer in the organic compound layer 8 is transmitted through the transparent electrode (the anode) 7 and reflected at a surface of the reflection plate 5, and the reflected light is scattered, thereby making it possible to improve the efficiency of extraction of light.

<Bottom Emission Type Organic Electroluminescence Display Device>

Figure 2:
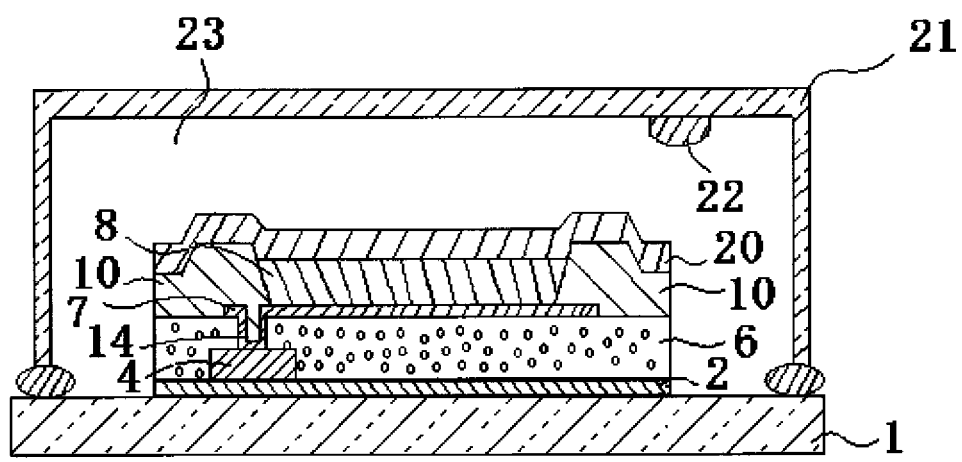
FIG. 2 is a view illustrating one example of a configuration of a bottom emission type organic electroluminescence display device.

The bottom emission type organic electroluminescence display device is provided with, for example, as illustrated in FIG. 2, a glass substrate 1 (refractive index: about 1.5), a passivation layer 2 which is placed on the glass substrate 1 and composed of $SiN_x$, SiON, etc., a fine particle-containing layer 6 which is placed on the passivation layer 2 and composed of an organic resin material (refractive index: about 1.5) and fine particles (refractive index: higher than 1.5, etc.), a transparent electrode (anode) 7 (refractive index: about 1.9) which is placed on the fine particle-containing layer 6 and composed of ITO or the like, an organic compound layer 8 (refractive index: about 1.8) which is placed on the transparent electrode (anode) 7 and includes a light emitting layer, etc., a counter electrode (a cathode) 20 which is placed on the organic compound layer 8 and composed of aluminum, silver or the like, a bank 10 which is placed on the fine particle-containing layer 6 so as to be contiguous to the transparent electrode (the anode) 7, the organic compound layer 8 and the counter electrode (a cathode) 20 and composed of an acrylic resin or the like, a sealing glass 21 which seals the passivation layer 2, the fine particle-containing layer 6, transparent electrode (anode) 7, the organic compound layer 8 and the counter electrode (the cathode) 20, and a desiccating agent 22 which is set on an inner surface of the sealing glass 21 so as to face the glass substrate 1. And, dry nitrogen is introduced in a sealed region 23 which is sealed by the sealing glass 21.

The fine particle-containing layer 6 also functions as a flattening film for flattening the organic thin film transistor (TFT) 4.

A contact hole 14 is formed in the fine particle-containing layer 6 so that the transparent electrode (the anode) 7 and the organic thin film transistor (TFT) 4 are connected to each other.

Since the fine particle-containing layer 6 has such a thin thickness of 2 μm to 10 μm, the contact hole 14 can be easily formed, thereby making it possible to reduce the production cost.

As a method of making the organic EL display device full colors, for example, as described in Monthly Display, pp. 33-37 (September, 2000), a three-color light-emitting method of arranging organic EL elements emitting lights corresponding to three primary colors (blue (B), green (G) and red (R))

of colors on a substrate, a white color method of separating white color emission by an organic EL element for white color emission to three colors through a color filter, and a color-converting method of converting blue color emission by an organic EL element for blue color emission to red (R) and green (G) through a fluorescent dye layer are known. Further, by using in combination of a plurality of organic EL elements different in luminescent colors capable of obtaining by the above method, plane light sources of desired luminescent colors can be obtained. For example, a white emission light source of combining luminescence devices of blue and yellow luminescence devices, and a white emission light source of combining luminescence devices of blue, green and red are exemplified.

EXAMPLES

Hereinafter, the present invention will be further described in detail with reference to specific Examples, however, the present invention is not limited thereto.

Example 1

Preparation of Fine Particle Dispersion Liquid

Zinc oxide (weight average particle diameter: 0.8 µm, refractive index: 2.0, produced by Sakai Chemical Industry Co., Ltd.) was added in a propylene glycol monomethyl acetate (PGMEA) solvent so that the amount of powder was 30% by weight, and dispersed by applying an ultrasonic wave for 10 minutes while cooling with ice, to prepare a dispersion liquid. The resulting dispersion liquid was subjected to measurement of a dispersed particle size distribution using a rich-mixture type particle size analyzer FPAR-1000 (manufactured by Otsuka Electronics Co., Ltd.) and was found to be a monodispersion with a peak value of 1.1 µm.

<Preparation of Acrylic Resin Solution>

As an acrylic resin solution, a solution of methacrylic acid-benzylmethacrylate copolymer (weight average molecular weight: about 10,000; methacrylic acid-benzyl-methacrylate=3:7 (molar ratio); refractive index of acrylic acid resin: 1.53; solid content: 45%; solvent: propylene glycol monomethylether acetate, produced by Fujikura Kasei Co., Ltd.) was prepared.

<Preparation of Fine Particle-Containing Layer>

The fine particle dispersion liquid was added to the acrylic resin solution with stirring, and a fine particle-containing layer-forming liquid so that a volume fraction of the zinc oxide fine particles to the resin was 20%.

<Production of Organic Electroluminescence Display Device>

Figure 3A:
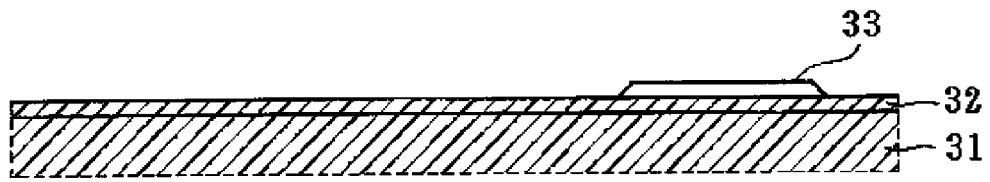
FIG. 3A is a view illustrating one example of a method for producing a TFT substrate for an organic EL display device (first step).

On a glass substrate serving as an insulating substrate 31, a buffer layer 32 composed of a $SiO_2$ film was formed by CVD method, a polycrystalline silicon layer was deposited on the buffer layer 32 by CVD method, and subsequently, an island-shaped polycrystalline silicon layer 33 was formed by an ordinarily used photo-etching process to form a laminate (FIG. 3A).

Figure 3B:
FIG. 3B is a view illustrating one example of a method for producing a TFT substrate for an organic EL display device (second step).

Subsequently, after a $SiO_2$ film was deposited on the entire surface of the thus formed laminate by CVD method, an AlNd film was deposited by sputtering, and then patterning of the $SiO_2$ film and the AlNd film was carried out by an ordinarily used photo-etching process to form a gate insulating film 34 and a gate electrode 35 (FIG. 3B).

Figure 3C:
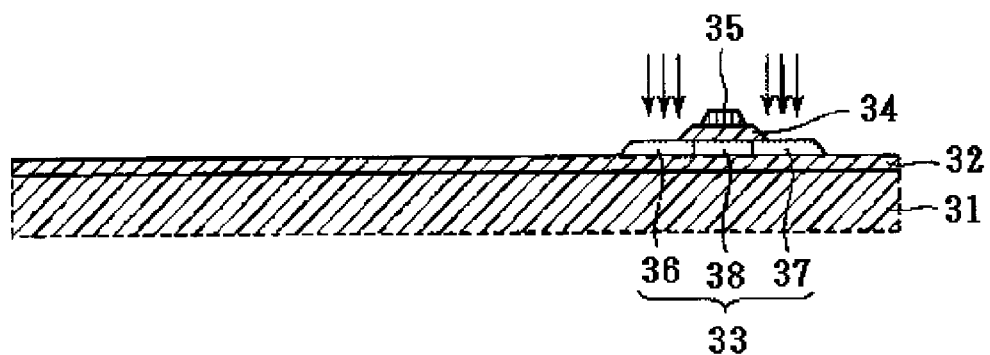
FIG. 3C is a view illustrating one example of a method for producing a TFT substrate for an organic EL display device (third step).

Next, the island-shaped polycrystalline silicon layer 33 was, for example, ion-implanted with phosphorous ions by ion implantation, using the gate electrode 35 as a mask to form a source region 36 and a drain region 37 in the island-shaped polycrystalline silicon layer 33 at both sides of the gate electrode 35, with the rest part of the island-shaped polycrystalline silicon layer 33 being provided as a channel layer 38 (FIG. 3C).

Figure 3D:
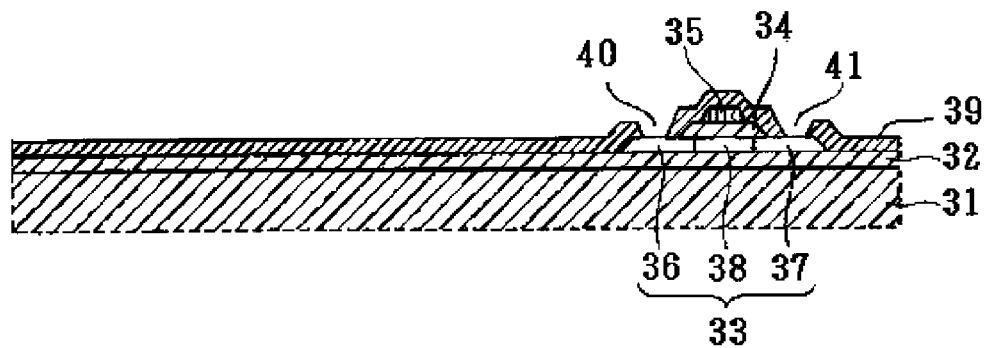
FIG. 3D is a view illustrating one example of a method for producing a TFT substrate for an organic EL display device (fourth step).

Next, after an interlayer insulating film 39 composed of a SiN film was deposited on the entire surface of the laminate by CVD method, contact holes 40 and 41 were formed so as to reach each of the source region 36 and the drain region 37 by an ordinarily used photo-etching process (FIG. 3D).

Figure 4:
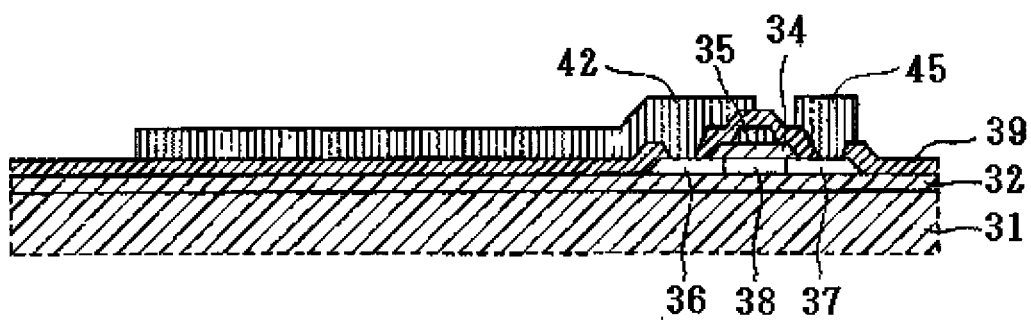
FIG. 4 is a view illustrating one example of a TFT substrate for an organic EL display device in a top emission type organic electroluminescence display device.

Next, a multi-layered conductive layer composed of Al/Ti/Al was deposited on the entire surface of the laminate, and patterning was carried out by an ordinarily used photo-etching process to form a source electrode 42 and a drain electrode 45, thereby producing a TFT substrate for organic EL (FIG. 4). Onto the TFT substrate for organic EL thus produced, the acrylic resin solution that had been prepared was applied by spin-coating to form an interlayer insulating layer having a thickness of 0.8 µm, and aluminum was deposited on the interlayer insulating layer by sputtering to form an Al reflection plate having a thickness of 10 nm.

Further, the fine particle-containing layer forming liquid that had been prepared was applied onto the Al reflection plate by spin-coating to form a fine particle-containing layer having a thickness of 3 µm. A contact hole (for connecting the organic thin film transistor (TFT) and the after-mentioned ITO electrode (anode)) was formed in the fine particle-containing layer, the Al reflection plate and the interlayer insulating layer, and then ITO (refractive index: about 1.9) was deposited on a surface of the laminate to form an ITO electrode (anode) having a thickness of 100 nm.

Further, on the ITO electrode (anode), organic compound layers (a hole injection layer, a hole transporting layer, a light emitting layer, and an electron injection layer) were formed in this order. First, the hole injection layer was formed by depositing 2-TNATA [4,4',4"-tris(2-naphthylphenylamino)triphenylamine] so as to have a thickness of 50 nm.

Further, on the hole injection layer, the hole transporting layer wad formed by depositing α-NPD [N,N'-(dinaphthylphenylamino)pyrene] so as to have a thickness of 50 nm. Furthermore, on the hole transporting layer, the light emitting layer was formed by depositing Alq3 [8-quinolinol-aluminum complex] so as to have a thickness of 50 nm. Finally, on the light emitting layer, the electron injection layer was formed by depositing a pyridine derivative so as to have a thickness of 25 nm.

Afterward, semi-transmissive cathodes (Al electrode and Ag electrode) were formed in this order by deposition.

First, the Al electrode was formed by depositing aluminum in thickness of 100 nm, and further depositing silver in thickness of 100 nm.

Further, SiON was deposited to form a sealing layer of 25 µm in thickness. Onto the sealing layer, a photo-curable type epoxy adhesive was applied to form an adhesive layer of 100 nm in thickness, and a glass substrate was provided on the adhesive layer for sealing, thereby producing a top-emission type organic electroluminescence display device.

<Evaluation of TFT Driving>

All the pixels of the organic electroluminescence display device thus produced were turned on, and whether or not there were defective pixels was evaluated. The results were evaluated according to the following five grades: in the case where no defective pixel is involved is graded "1"; the ratio of defective pixels to all the pixels being more than 0% and less than 5% is graded "2"; the ratio of defective pixels to all the pixels being equal to or more than 5% and less than 10% is graded "3"; the ratio of defective pixels to all the pixels being equal to or more than 10% and less than 50% is graded "4"; and the ratio of defective pixels to all the pixels being 50% or more is graded "5". The evaluation results are shown in Table 1.

<Measurement of Overall Light Intensity>

An integrating sphere device equipped with a photo-sensor was attached to the produced organic electroluminescence display device. Then, a 5 V-voltage was applied to the organic EL display device to allow it to emit light, and the overall amount of light emitted at its light extraction surface was measured. Specifically, relative overall light intensities (the overall light intensity when the overall light amount of the after-mentioned organic EL display device of Comparative Example 1 was regarded as "1") were compared to each other. The results are shown in Table 1.

<Evaluation of Image Bleeding>

Images and characters were allowed to be displayed on the screen of the produced organic electroluminescence display device, and the level of image bleeding was visually observed and evaluated according to the following criteria. The evaluation results are shown in Table 1.

<<Evaluation Criteria>>

No image bleeding was observed: 1
Image bleeding was not almost observed: 2
Image bleeding was slightly observed: 3
Image bleeding was observed: 4
Image bleeding was observed, and the visibility seriously degraded: 5

Comparative Example 1

A top emission type organic electroluminescence display device was produced in the same manner as in Example 1 except that as the fine particle-containing layer-forming liquid, an acrylic resin solution prepared without adding any fine particle dispersion liquid was directly used instead of using the acrylic resin solution into which the fine particle dispersion liquid had been added. Then, the resulting organic EL display device was subjected to evaluation of TFT driving, overall light intensity, and image bleeding. The evaluation results are shown in Table 1.

Example 2

A top emission type organic electroluminescence display device was produced in the same manner as in Example 1 except that a polydispersed fine particle dispersion liquid (measured peak value of a dispersion particle size distribution: 2.8 µm) without being subjected to 10-minute ultrasonic wave dispersion was used instead of using the monodispersed fine particle dispersion liquid that had been subjected to 10-minute ultrasonic wave dispersion (measured peak value of a dispersion particle size distribution: 1.1 µm). Then, the resulting organic EL display device was subjected to evaluation of TFT driving, overall light intensity, and image bleeding. The evaluation results are shown in Table 1.

Example 3

A top emission type organic electroluminescence display device was produced in the same manner as in Example 1 except that a fine particle dispersion liquid (monodispersion, measured peak value of a dispersion particle size distribution: 2.3 µm) of melamine (weight average particle diameter: 2.0 refractive index: 1.65, produced by Nissan Chemical Industries Ltd.) was used to form a fine particle-containing layer forming liquid so that a volume fraction of the melamine fine particles to the resin was 15% and a fine particle-containing layer having a thickness of 10 µm was formed, instead of using the fine particle dispersion liquid (monodispersion, measured peak value of a dispersion particle size distribution: 1.1 µm) of zinc oxide (weight average particle diameter: 0.8 refractive index: 2.0, produced by Sakai Chemical Industry Co., Ltd.) to from a fine particle-containing layer forming liquid so that a volume fraction of the zinc oxide fine particles was 20%, and forming the fine particle-containing layer having a thickness of 3 µm. Then, the resulting organic EL display device was subjected to evaluation of TFT driving, overall light intensity, and image bleeding. The evaluation results are shown in Table 1.

Example 4

A top emission type organic electroluminescence display device was produced in the same manner as in Example 1 except that a fine particle dispersion liquid (monodispersion, measured peak value of a dispersion particle size distribution: 0.7 µm) of zirconia (weight average particle diameter: 0.6 refractive index: 2.3, produced by Daiichi Kigenso Kagaku Kogyo Co., Ltd.) was used, and as the acrylic resin solution, a polyimide resin solution (solid content: 45%; solvent: propylene glycol monomethylether acetate, produced by Fujikura Kasei Co., Ltd.) was prepared to form a fine particle-containing layer forming liquid so that a volume fraction of the zirconia fine particles to the resin was 10% and a fine particle-containing layer having a thickness of 2 µm was formed, instead of using the fine particle dispersion liquid (monodispersion, measured peak value of a dispersion particle size distribution: 1.1 µm) of zinc oxide (weight average particle diameter: 0.8 µm, refractive index: 2.0, produced by Sakai Chemical Industry Co., Ltd.) and preparing, as the acrylic resin solution, a solution of methacrylic acid-benzylmethacrylate copolymer (weight average molecular weight: about 10,000; methacrylic acid-benzylmethacrylate=3:7 (molar ratio); refractive index of acrylic acid resin: 1.53; solid content: 45%; solvent: propylene glycol monomethylether acetate, produced by Fujikura Kasei Co., Ltd.) to form a fine particle-containing layer forming liquid so that a volume fraction of the zinc oxide fine particles was 20%, and forming the fine particle-containing layer having a thickness of 3 µm. Then, the resulting organic EL display device was subjected to evaluation of TFT driving, overall light intensity, and image bleeding. The evaluation results are shown in Table 1.

Note that the polyimide resin was obtained from a polyimide precursor, and the synthesis of the polyimide precursor was carried out according to the following procedure.

In a solution prepared by dissolving 4,4'-diaminodiphenylether (DDE)(4.9 g) in N,N-dimethylacetoamide (DMAc) (40 mL), a powder (5.5 g) of equivalent moles of pyromellitic acid dianhydride (PMDA) was gradually added and stirred for about 3 hours to thereby obtain polyamic acid (PAA) being a precursor of polyimide.

Example 5

A top emission type organic electroluminescence display device was produced in the same manner as in Example 4 except that a fine particle-containing layer forming liquid was prepared so that a volume fraction of the zirconia fine particles to the resin was 8% was prepared, an interlayer insulating layer having a thickness of 1.0 µm was formed and a fine particle-containing layer having a thickness of 5 µm, instead of preparing the fine particle-containing layer forming liquid so that a volume fraction of the zirconia fine particles to the resin was 10%, forming the interlayer insulating layer having a thickness of 0.8 μm and forming the fine particle-containing layer having a thickness of 2 μm. Then, the resulting organic EL display device was subjected to evaluation of TFT driving, overall light intensity, and image bleeding. The evaluation results are shown in Table 1.

Example 6

A top emission type organic electroluminescence display device was produced in the same manner as in Example 4 except that a fine particle dispersion liquid (monodispersion, measured peak value of a dispersion particle size distribution: 0.55 μm) of benzoguanamine (weight average particle diameter: 0.55 refractive index: 1.66, produced by Nippon Shokubai Co., Ltd.) was used to prepare a fine particle-containing layer forming liquid so that a volume fraction of the benzoguanamine fine particles to the resin was 17%, and a fine particle-containing layer having a thickness of 5 μm was formed, instead of using the fine particle dispersion liquid (monodispersion, measured peak value of a dispersion particle size distribution: 0.7 μm) of zirconia (weight average particle diameter: 0.6 μm, refractive index: 2.3, produced by Daiichi Kigenso Kagaku Kogyo Co., Ltd.) so that a volume fraction of the zirconia fine particles to the resin was 10% and forming a fine particle-containing layer having a thickness of 2 μm. Then, the resulting organic EL display device was subjected to evaluation of TFT driving, overall light intensity, and image bleeding. The evaluation results are shown in Table 2.

Comparative Example 2

A top emission type organic electroluminescence display device was produced in the same manner as in Example 4 except that a fine particle dispersion liquid (monodispersion, measured peak value of a dispersion particle size distribution: 1.0 μm) of silica (weight average particle diameter: 1.0 refractive index: 1.43, produced by Nippon Shokubai Co., Ltd.) was used to prepare a fine particle-containing layer forming liquid so that a volume fraction of the silica fine particles to the resin was 15%, and a fine particle-containing layer having a thickness of 4 μm was formed, instead of using the fine particle dispersion liquid (monodispersion, measured peak value of a dispersion particle size distribution: 0.7 μm) of zirconia (weight average particle diameter: 0.6 refractive index: 2.3, produced by Daiichi Kigenso Kagaku Kogyo Co., Ltd.) so that a volume fraction of the zirconia fine particles to the resin was 10% and forming a fine particle-containing layer having a thickness of 2 μm. Then, the resulting organic EL display device was subjected to evaluation of TFT driving, overall light intensity, and image bleeding. The evaluation results are shown in Table 2.

Example 7

A top emission type organic electroluminescence display device was produced in the same manner as in Example 4 except that the production procedure of an organic electroluminescence display device of Example 4 was changed to the production procedure described below and a bottom emission type organic electroluminescence display device was produced. Then, the resulting organic EL display device was subjected to evaluation of TFT driving, overall light intensity, and image bleeding. The evaluation results are shown in Table 2.

<Production of Organic Electroluminescence Display Device>

On a glass substrate serving as an insulating substrate 31, a buffer layer 32 composed of a $SiO_2$ film was formed by CVD method, a polycrystalline silicon layer was deposited on the buffer layer 32 by CVD method, and subsequently, an island-shaped polycrystalline silicon layer 33 was formed by an ordinarily used photo-etching process to form a laminate (FIG. 3A).

Subsequently, after a $SiO_2$ film was deposited on the entire surface of the thus formed laminate by CVD method, an AlNd film was deposited by sputtering, and then patterning of the $SiO_2$ film and the AlNd film was carried out by an ordinarily used photo-etching process to form a gate insulating film 34 and a gate electrode 35 (FIG. 3B).

Next, the island-shaped polycrystalline silicon layer 33 was, for example, ion-implanted with phosphorous ions by ion implantation, using the gate electrode 35 as a mask to form a source region 36 and a drain region 37 in the island-shaped polycrystalline silicon layer 33 at both sides of the gate electrode 35, with the rest part of the island-shaped polycrystalline silicon layer 33 being provided as a channel layer 38 (FIG. 3C).

Next, after an interlayer insulating film 39 composed of a SiN film was deposited on the entire surface of the laminate by CVD method, contact holes 40 and 41 were formed so as to reach each of the source region 36 and the drain region 37 by an ordinarily used photo-etching process (FIG. 3D).

Figure 5:
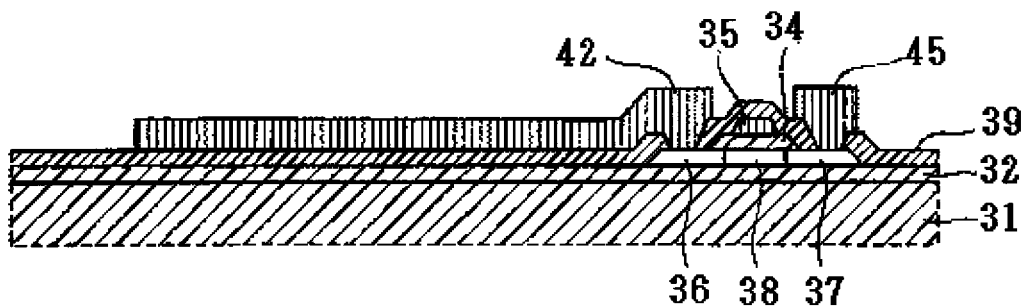
FIG. 5 is a view illustrating one example of a TFT substrate for an organic EL display device in a bottom emission type organic electroluminescence display device.

Next, a multi-layered conductive layer composed of Al/Ti/Al was deposited on the entire surface of the laminate, and patterning was carried out by an ordinarily used photo-etching process to form a source electrode 42 and a drain electrode 45, thereby producing a TFT substrate for organic EL (FIG. 5). Onto the TFT substrate for organic EL thus produced, the fine particle-containing layer forming liquid that had been prepared was applied by spin-coating to form a fine particle-containing layer having a thickness of 2 μm. A contact hole (for connecting the organic thin film transistor (TFT) and the after-mentioned ITO electrode (anode)) was formed in the fine particle-containing layer, and ITO (refractive index: about 1.9) was deposited on a surface of the laminate to form an ITO electrode (anode) having a thickness of 100 nm.

Further, on the ITO electrode (anode), organic compound layers (a hole injection layer, a hole transporting layer, a light emitting layer, and an electron injection layer) were formed in this order. First, the hole injection layer was formed by depositing 2-TNATA [4,4',4''-tris(2-naphthylphenylamino)triphenylamine] so as to have a thickness of 50 nm. Further, on the hole injection layer, the hole transporting layer wad formed by depositing α-NPD [N,N'-(dinaphthylphenylamino) pyrene] so as to have a thickness of 50 nm. Furthermore, on the hole transporting layer, the light emitting layer was formed by depositing Alq3 [8-quinolinol-aluminum complex] so as to have a thickness of 50 nm. Finally, on the light emitting layer, the electron injection layer was formed by depositing a pyridine derivative so as to have a thickness of 25 nm.

Afterward, cathodes (Al electrode and Ag electrode) were formed in this order by deposition.

First, the Al electrode was formed by depositing aluminum in thickness of 100 nm, and further depositing silver in thickness of 100 nm.

Further, a sealing glass with a desiccating agent attached thereto was provided to seal the laminate, and dry nitrogen is introduced in a sealed region, thereby producing a bottom-emission type organic electroluminescence display device.

Evaluation test results using the bottom emission type organic EL display device are shown in Table 2.

Comparative Example 3

A bottom emission type organic electroluminescence display device was produced in the same manner as in Example 7 except that as the fine particle-containing layer forming liquid, a polyimide resin solution prepared without adding any fine particle dispersion liquid was directly used instead of using the polyimide resin solution into which the fine particle dispersion liquid had been added. Then the resulting organic EL display device was subjected to evaluation of TFT driving, overall light intensity, and image bleeding. The evaluation results are shown in Table 2.

Example 8

A top emission type organic electroluminescence display device was produced in the same manner as in Example 1 except that a fine particle dispersion liquid (monodispersion, measured peak value of a dispersion particle size distribution: 0.7 μm) of titanium oxide (weight average particle diameter: 0.5 μm, refractive index: 2.6, produced by Sakai Chemical Industry Co., Ltd.) was used, a polyphenylene ether resin solution was prepared, a fine particle-containing layer forming liquid was prepared so that a volume fraction of the titanium oxide fine particles to the polyphenylene ether resin was 10%, an interlayer insulting layer having a thickness of 1 μm was formed and a fine particle-containing layer having a thickness of 2 μm was formed, instead of using the fine particle dispersion liquid of zinc oxide (weight average particle diameter: 0.8 μm, refractive index: 2.0, produced by Sakai Chemical Industry Co., Ltd.), preparing, as the acrylic resin solution, a solution of methacrylic acid-benzylmethacrylate copolymer (weight average molecular weight: about 10,000; methacrylic acid-benzylmethacrylate=3:7 (molar ratio); refractive index of acrylic acid resin: 1.53; solid content: 45%; solvent: propylene glycol monomethylether acetate, produced by Fujikura Kasei Co., Ltd.), preparing a fine particle-containing layer forming liquid so that a volume fraction of the zinc oxide fine particles to the acrylic resin was 20%, forming an interlayer insulting layer having a thickness of 0.8 μm and forming a fine particle-containing layer having a thickness of 3 μm. Then, the resulting top emission type organic EL display device was subjected to evaluation of TFT driving, overall light intensity, and image bleeding. The evaluation results are shown in Table 2.

The preparation of the polyphenylene ether resin solution was carried out in the following manner.

First, 3-methylcatechol (4.96 g) and dihydropyran (1.81 mL) were dissolved in 6.0 mL of toluene, and 0.025 g of pyridinium p-toluene sulfonate was added while maintaining the temperature of the reaction system from 0° C. to 5° C. After the reaction system was stirred for a few minutes, 3.62 mL of dihydropyran that had been dissolved in 2.0 mL of toluene was slowly delivered by drops into the reaction system. Further, 0.025 g of pyridinium para-toluene sulfonate was added thereto, and the reaction system was stirred under a nitrogen atmosphere for 1 hour at room temperature. The reaction solution was diluted with 60 mL and washed with a 0.2% sodium hydroxide aqueous solution to obtain an ether-layer. The ether-layer formed was dried with sodium sulfate to distill away the ether component. The rest of colorless and oily substance was purified by a column chromatography (silica gel, toluene) to thereby yield 2-(tetrahydropyran-2-yl) oxy-6-methylphenol.

Next, 1.0 mL of pyridine was added to 0.030 g of cuprous chloride, and stirred under a nitrogen atmosphere to obtain a copper (ID-pyridine complex solution. Into this solution, 2-(tetrahydropyran-2-yl)oxy-6-methyphenol and 2,6-xylenol in a combined amount of 6.0 mmol (molar ratio: 75:25), and 5.0 mL of sodium sulfate compounded with toluene were added and reacted at room temperature for 2 hours. Upon completion of the reaction, the reaction solution was poured into methanol, and a brown sediment was obtained. The sediment was filtered out, and then dissolved in tetrahydrofuran. A slight amount of hydrochloric acid was added to the sediment to perform deprotection. Further, the sediment was put into a hydrochloric aqueous solution, and a sediment was obtained. The sediment was then filtered out and washed with water to obtain a polyphenylene ether resin (weight average molecular weight: 23,000, refractive index: 1.64).

The polyphenylene ether resin in an amount of 30 parts by mass was dissolved in 70 parts by mass of cyclohexanone (produced by Kanto Kagaku K.K.) to prepare a polyphenylene ether resin solution.

TABLE 1

| | | Example 1 | Comp. Ex. 1 | Example 2 | Example 3 | Example 4 | Example 5 |
|---|---|---|---|---|---|---|---|
| Interlayer insulating film | Composition | acrylic resin | acrylic resin | acrylic resin | acrylic resin | polyimide resin | polyimide resin |
| | Film thickness | 0.8 μm | 0.8 μm | 0.8 μm | 0.8 μm | 0.8 μm | 1.0 μm |
| Fine particle-containing layer | Resin | acrylic resin | acrylic resin | acrylic resin | acrylic resin | polyimide resin | polyimide resin |
| | Refractive index of resin | 1.53 | 1.53 | 1.53 | 1.53 | 1.62 | 1.62 |
| | Film thickness | 3 μm | 3 μm | 3 μm | 10 μm | 2 μm | 5 μm |
| | Fine particles | zinc oxide | — | zinc oxide | melamine | zirconia | zirconia |
| | Refractive index of fine particles | 2.0 | — | 2.0 | 1.65 | 2.3 | 2.3 |
| | Average particle diameter of fine particles | 0.8 μm | — | 0.8 μm | 2.0 μm | 0.6 μm | 0.6 μm |
| | Volume fraction of fine particles | 20% | — | 20% | 15% | 10% | 8% |
| | Measured peak value of dispersion particle size distribution | 1.1 μm | — | 2.8 μm | 2.3 μm | 0.7 μm | 0.7 μm |
| | Measured result of dispersed particle size | monodispersion | | polydispersion | monodispersion | monodispersion | monodispersion |

TABLE 1-continued

|  | Example 1 | Comp. Ex. 1 | Example 2 | Example 3 | Example 4 | Example 5 |
|---|---|---|---|---|---|---|
| Top emission type/ Bottom emission type | Top | Top | Top | Top | Top | Top |
| TFT | 1 | 1 | 2 | 2 | 1 | 1 |
| Overall light intensity | 1.6 | 1.0 | 1.2 | 1.4 | 1.7 | 1.9 |
| Evaluation of image bleeding | 1 | 1 | 3 | 2 | 1 | 2 |

TABLE 2

| | | Example 6 | Comp. Ex. 2 | Example 7 | Comp. 3 | Example 8 |
|---|---|---|---|---|---|---|
| Interlayer insulating film | Composition | polyimide resin | polyimide resin | — | — | polyphenylene ether resin |
| | Film thickness | 0.8 μm | 0.8 μm | — | — | 1 μm |
| Fine particle-containing layer | Resin | polyimide resin | polyimide resin | polyimide resin | polyimide resin | polyphenylene ether resin |
| | Refractive index of resin | 1.62 | 1.62 | 1.62 | 1.62 | 1.64 |
| | Film thickness | 5 μm | 4 μm | 2 μm | — | 2 μm |
| | Fine particles | benzoguanamine | silica | zirconia | — | titanium oxide |
| | Refractive index of fine particles | 1.66 | 1.43 | 2.3 | — | 2.6 |
| | Average particle diameter of fine particles | 0.55 μm | 1.0 μm | 0.6 μm | — | 0.5 μm |
| | Volume fraction of fine particles | 17% | 15% | 10% | — | 10% |
| | Measured peak value of dispersion particle size distribution | 0.55 μm | 1.0 μm | 0.7 μm | — | 0.7 μm |
| | Measured result of dispersed particle size | monodispersion | monodispersion | monodispersion | | monodispersion |
| Top emission type/ Bottom emission type | | Top | Top | Bottom | Bottom | Top |
| TFT | | 1 | 1 | 1 | 1 | 1 |
| Overall light intensity | | 1.3 | 0.8 | 1.5 | 0.9 | 1.8 |
| Evaluation of image bleeding | | 2 | 3 | 1 | 1 | 1 |

The results shown in Tables 1 and 2 demonstrated that the organic electroluminescence display devices of Examples 1 to 8 having a refractive index of the organic resin material in the fine particle-containing layer of from 1.53 to 1.64, which was lower than that of the transparent electrode (ITO anode) of about 1.9, and having a refractive index of the fine particles in the fine particle-containing layer of from 1.65 to 2.6, which was higher than that of the organic resin material of 1.53 to 1.64, and having a weight average particle diameter and a thickness of the fine particles in the fine particle-containing layer of 0.5 μm to 5 μm, and 2 μm to 10 μm, respectively, resulted in an improvement in efficiency of extraction of light (overall light intensity), compared with the organic electroluminescence display devices of Comparative Examples 1 and 3 where a fine particle-containing layer was not provided, and with the organic electroluminescence display devices of Comparative Example 2 having a refractive index of the fine particles in the fine particle-containing layer being lower than that of the organic resin material.

In addition, it was found that the organic electroluminescence display devices of Example 1, 2, and 4 to 8, where the measured dispersed particle size of the fine particles was monodispersion, had more improved efficiency of extraction of light (overall light intensity) and more favorable evaluation results of image bleeding than those of the organic electroluminescence display device of Example 3 where the measured dispersed particle size of the fine particles was polydispersion.

The organic electroluminescence display device of the present invention is capable of improving the efficiency of extraction of light, has luminance, and is suitable for both a bottom emission type organic electroluminescence display device and a top emission type organic electroluminescence display device. It is suitably used, for example, for organic EL illumination, and the like.

What is claimed is:

1. An organic electroluminescence display device comprising:
    an organic electroluminescence element which comprises a transparent electrode, a counter electrode, and an organic compound layer provided between the transparent electrode and the counter electrode, the organic compound layer including a light emitting layer,
    a fine particle-containing layer positioned in the optical path of light emitted from the light emitting layer and adjacent to the transparent electrode and a reflection plate disposed on a surface of the fine particle-containing layer opposite to a surface thereof provided with the transparent electrode,
    an interlayer insulating layer disposed on a surface of the reflection plate opposite to the surface of the reflection plate that is adjacent to the fine particle-containing layer, and
    a passivation layer disposed on a surface of the interlayer insulating layer opposite to the surface of the interlayer insulating layer that is adjacent to the reflection plate, wherein the fine particle-containing layer comprises an organic resin material having a refractive index equal to or lower than the refractive index of the transparent electrode, and fine particles having a refractive index higher than the refractive index of the organic resin material and a weight average particle diameter of 0.5 µm to 5 µm, and the fine particle-containing layer has a thickness of 2 µm to 10 µm.

2. The organic electroluminescence display device according to claim 1, wherein the fine particles in the fine particle-containing layer are primary particles.

3. The organic electroluminescence display device according to claim 1, wherein the fine particle-containing layer further comprises a fine-particle dispersant.

4. The organic electroluminescence display device according to claim 1, further comprising a substrate disposed on a surface of the passivation layer.

5. The organic electroluminescence display device according to claim 1, further comprising an organic thin-film transistor disposed on the passivation layer.

6. The organic electroluminescence display device according to claim 5, wherein the drive system of the organic electroluminescence display device is a thin-film transistor drive.

7. The organic electroluminescence display device according to claim 5, wherein in the fine particle-containing layer, a contact hole is formed for connecting the transparent electrode and the organic thin-film transistor.

* * * * *